United States Patent
Li et al.

(10) Patent No.: US 11,613,695 B2
(45) Date of Patent: Mar. 28, 2023

(54) LUMINESCENT AND DISPERSIBLE HYBRID MATERIALS COMBINING IONIC AND COORDINATE BONDS IN MOLECULAR CRYSTALS

(71) Applicant: Rutgers, The State University of New Jersey, New Brunswick, NJ (US)

(72) Inventors: Jing Li, Cranbury, NJ (US); Wei Liu, New Brunswick, NJ (US); Kun Zhu, Piscataway, NJ (US)

(73) Assignee: RUTGERS, THE STATE UNIVERSITY OF NEW JERSEY, New Brunswick, NJ (US)

( * ) Notice: Subject to any disclaimer, the term of this patent is extended or adjusted under 35 U.S.C. 154(b) by 470 days.

(21) Appl. No.: 16/610,712

(22) PCT Filed: May 2, 2018

(86) PCT No.: PCT/US2018/030596
§ 371 (c)(1),
(2) Date: Nov. 4, 2019

(87) PCT Pub. No.: WO2018/204461
PCT Pub. Date: Nov. 8, 2018

(65) Prior Publication Data
US 2020/0263085 A1 Aug. 20, 2020

Related U.S. Application Data

(60) Provisional application No. 62/501,517, filed on May 4, 2017.

(51) Int. Cl.
*C09K 11/06* (2006.01)
*C07F 1/08* (2006.01)
(Continued)

(52) U.S. Cl.
CPC ............. *C09K 11/06* (2013.01); *C07F 1/08* (2013.01); *H01L 33/502* (2013.01); *H01L 33/60* (2013.01);
(Continued)

(58) Field of Classification Search
CPC ..... C09K 11/06; C09K 2211/188; C07F 1/08; C07F 1/005; C07F 9/5045; H01L 33/502;
(Continued)

(56) References Cited

U.S. PATENT DOCUMENTS 8,163,951 B2 * 4/2012 Szarvas ............. C07D 295/037
558/39
9,051,284 B2 6/2015 Zheng et al.
(Continued)

FOREIGN PATENT DOCUMENTS

CN 101348459 A 1/2009
WO WO-2014201377 A1 * 12/2014 ............ C09K 11/06
WO WO-2017205092 A1 * 11/2017 ........... H01L 51/009

OTHER PUBLICATIONS

Achelle et al., Recent Advances in Pyrimidine derivative as luminescent, Universte de Rennes, (2013) (Year: 2013).*
(Continued)

*Primary Examiner* — Ermias T Woldegeorgis
(74) *Attorney, Agent, or Firm* — Fox Rothschild LLP

(57) ABSTRACT

Inorganic-organic hybrid structures having both ionic and coordinate bonds in a molecular cluster possessing the features of structural diversity, high luminescence and stability, and excellent dispersibility, suitable for use as lighting phosphors.

21 Claims, 8 Drawing Sheets

(51) Int. Cl.
  *H01L 33/50* (2010.01)
  *H01L 33/60* (2010.01)
  *H01L 51/00* (2006.01)

(52) U.S. Cl.
  CPC .... *H01L 51/0091* (2013.01); *C09K 2211/188* (2013.01); *H01L 2933/0041* (2013.01)

(58) Field of Classification Search
  CPC ............... H01L 33/60; H01L 51/0091; H01L 2933/0041; H01L 51/50
  See application file for complete search history.

(56) References Cited

U.S. PATENT DOCUMENTS

| | | |
|---|---|---|
| 2005/0221118 A1 | 10/2005 | Brunner et al. |
| 2016/0133839 A1* | 5/2016 | Li .......................... C09K 11/06 257/40 |

OTHER PUBLICATIONS

Keefe et al. Luminescent sensor molecules based on coordinated metals, Department of Chemistry and materials, Northwestern univeristy, 205 (2000), 201-228 (Year: 1999).*

Cook et al., The infrared spectra of caffeine salts, Canadian journal of chemistry, vol. 45, 2895 (1967) (Year: 1967).*

Hou, et al: "Crystal Structures of Two Copper(I) Iodides: Chained [CuI(bta)} and Tetranuclear [(mdabco)2Cu4I6] (bta=Benzotriazole; mdabco=N-methyl-1,4-diazabicyclo[2,2,2]octane)", Journal of Cluster Science, Oct. 28, 2011, vol. 22, No. 4, pp. 715-722, DOI 10.1007/S10876-011-0418-y.

Cheng, et al: A Simultaneous Redox, Alkylation, Self-Assembly Reaction under Solvothermal Conditions Afforded a Luminescent Copper(I) Chain Polymr Constructed of Cu3I4- and EtS-4-C5H4N+ Et Components (Et=CH3CH2), Journal of the American Chemical Society, Jun. 1, 2004, vol. 126, No. 25, , pp. 7796-7797.

Li, et al: "An ionic compound containing molecular iodine (ipq)4(Cu2I6) 2I2: Synthesis and theoretical investigation", Journal of Molecular Structure, Elsevier Amsterdam, NL, Sep. 30, 2009, No. 934, No. 1-3, pp. 112-116.

Zhang, et al: "Self-assembly, Crystal Structure and Fluorescent Property of a Coordination Polymer {(Cu4I6)(BPE)n", Synthesis and Reactivity in Inorganic, Metal-Organic Nano-Metal Chemistry, Nov. 30, 2009, vol. 39, No. 10, pp. 633-636.

Wang, et al: "Synthesis, Crystal Structure, and Charactierization of a Novel Coordinated Polymer [Cu2I4(Nppch)2]", Synthesis and Reactivity in Inorganic, Metal-Organic Nano-Metal Chemistry, Oct. 1, 2011, vol. 41, No. 9, pp. 1086-1090.

Chen, et al: "Syntheses, crystal structures and luminescent properties of three new halogencuprate(I) complexes with 4-(trimethylammonio) phenyldisulphide", Journal of Molecular Structure, Elsevier Amsterdam, NL, Feb. 20, 2006, vol. 784, No. 1-3, pp. 24-31.

Qing, et al: "Fabrication and photoluminescence of the composite films assembled from meso-tetra-(4-trimethylaminophenyl) porphyrin copper iodide and CdSe nanoparticles", Yingyong huaxue, Jan. 1, 2010, pp. 1409-1412, DOI: 10.3724/SP.J.1095.2010.00126.

Tershansy et al: "[Co(phen3)]2[Cu11I15]: A Mixed-Metal Iodocuprate Containing the Novel [Cu10I15]5- and [Cu12I15]3-Clusters", CRYSTENGCOMM, Jan. 1, 2008, vol. 10, No. 7, p. 833, XP055953148, GB, ISSN: 1466-8033, DOI: 10.1039/b716031 c.

Wu et al: "Anionic Cu n I n Cluster-Based Architectures Induced by In Situ Generated N-Alkylated Cationic Triazolium Salts", Crystal Growth & Design, Feb. 1, 2008, vol. 8, No. 2, pp. 568-574, XP055953147, US, ISSN: 1528-7483, DOI: 10.1021 /cg070639f.

Lei et al: "Low-Dimensional Hybrid Cuprous Halides Directed by Transition Metal Complex: Syntheses, Crystal Structures, and Photocatalytic Properties", Crystal Growth & Design, Nov. 4, 2015, vol. 15, No. 11, pp. 5416-5426, XP055953155, US, ISSN: 1528-7483, DOI: 10.1021/acs.cgd.5b01037.

Huang et al: "Metal-Cation-Directed Assembly of Two M-I (M=Cu, Ag) Clusters: Structures, Thermal Behaviors, Theoretical Studies, and Luminescence Properties", Journal of Cluster Science, Apr. 20, 2016, vol. 27, No. 4, pp. 1463-1474, XP035998765, ISSN: 1040-7278, DOI: 10.1007/S10876-016-1012-0.

Cook, et al: "The Infrared Spectra of Caffeine Salts", Dec. 1967, Canadian Journal of Chemistry, vol. 45, No. 23, pp. 2895-2897.

Keefe, et al: "Luminescent Sensor Molecules Based on Coordinated Metals: A Review of Recent Developments", Coordination Chemistry Reviews, Aug. 2000, vol. 205, No. 1, pp. 201-228.

Achelle, et al: "Recent Advances in Pynmidine Denvatives as Luminescent, Photovoltaic and Non-Linear Optical Materials", in book: Targets in HetercycLic systems, itaLian ChemicaL Society, Dec. 2013, pp. 1-38.

Liu, et al: All-in-One: Achieving Robust, Strongly Luminescent and Highly Dispersible Hybrid Materials by Combining Ionic and Coordinate Bonds in Molecular Crystals, Journal of the American Chemical Society, 2017, vol. 139, pp. 9281-9290.

* cited by examiner

LUMINESCENT AND DISPERSIBLE HYBRID MATERIALS COMBINING IONIC AND COORDINATE BONDS IN MOLECULAR CRYSTALS

CROSS-REFERENCE TO RELATED APPLICATION

The present application is the U.S. National Phase of International Patent Application Serial No. PCT/US18/30596, filed May 2, 2018, which claims the benefit of priority under 35 U.S.C. § 119(e) of U.S. Provisional Application Ser. No. 62/501,517, filed May 4, 2017. The entire disclosures of the applications noted above are incorporated herein by reference.

STATEMENT REGARDING FEDERALLY FUNDED RESEARCH

This invention was made in part with government support under Grant No. DMR-1507210 awarded by the National Science Foundation. The government has certain rights in the invention.

FIELD OF THE INVENTION

The present invention relates to the field of light emitting materials, which emit strongly over the entire visible spectrum, including for example white, orange, green, blue and yellow color, devices made therefrom, and methods of making these materials and devices.

BACKGROUND OF THE INVENTION

One of the well-explored hybrid material families consists of I-VII binary metal halides (e.g. CuI). Most of them are constructed by forming coordinate bonds between neutral inorganic modules of various dimensionality and neutral organic ligands (either aromatic or aliphatic) via an electron lone-pair of N, P or S atom. A wealth of many structure types have been reported, ranging from molecular (0D) species to one-dimensional (1D) chains, and from two-dimensional (2D) layers to extended three-dimensional (3D) networks. Their potential for use as lighting phosphors that are free of rare-earth elements (REEs) has been recognized and systematically evaluated very recently. These studies reveal that structures built on cluster-based $Cu_mI_m$ modules (e.g. $Cu_2I_2$ rhomboid dimer or $Cu_4I_4$ cubane tetramer) typically have much higher luminescence efficiency compared to those made of inorganic modules of higher dimensions, such as 1D chain or 2D layer of $(CuI)_\infty$. While structures with strong emission and enhanced stability can be achieved by incorporating highly emissive inorganic cores and strong binding ligands to generate extended 1D, 2D and 3D networks, serious limitations remain, for example low blue-light excitability and poor solution processibility, the latter being the common problem for most inorganic materials.

A need thus exists for the design of phosphors with improved chemical and thermal stability, while having strong blue excitability and high processability.

SUMMARY OF THE INVENTION

The present invention met such a need. Described herein is a novel class of phosphor compounds that emit light of different colors with high luminescence quantum efficiency. Coupled with improved thermal and chemical stability, the phosphor compounds of the present invention find application in clean and/or renewable energy devices, including but not limited to photovoltaics and solid-state lighting.

An aspect of the invention provides a phosphor cluster compound of $Cu_mX_{m+n}(L)_n$. X is an anion. L is an cationic organic ligand, wherein at least two atoms of the ligand are heteroatoms independently selected from the group consisting of N, O and S, one of the at least two heteroatoms is a positively charged N, and the other is coordinated to Cu. m is an integer selected from the group consisting of 1, 2, 3, 4, 5, 6, 7, 8, 9 and 10, and n is 1, 2, 3, 4 or 5. The atoms of said compound are arranged to form a network having a 1D, 2D or 3D crystalline lattice structure.

In some embodiments, X is a halide. In some embodiments, X is I. In some embodiments, m is selected from the group consisting of 2, 3, 4, 5, 6, 7 or 8, and n is 1 or 2. In some embodiments, m is 2 and n is 1. In some embodiments, m is 4, 5, 6, 7 or 8, and n is 2.

In some embodiments, the positively charged N is sp3 hybridized. In some embodiments, 1, 2 or 3 groups bonding to the positively charged N are independently selected from $C_1$-$C_{10}$ alkyls, said alkyls optionally substituted with one or more groups selected from halogen, —$OR^1$, —$SR^1$, –$C_1$-$C_4SR^1$, —$NO_2$, —CN and —$NR^aR^b$, wherein $R^1$ at each occurrence is independently hydrogen (H) or $C_1$-$C_4$ alkyl, and $R^a$ and $R^b$ are independently hydrogen or $C_1$-$C_4$ alkyl.

In some embodiments, the positively charged N is sp2 hybridized and is a ring atom of an aromatic system. The aromatic system is optionally substituted with one or more substituents selected from the group consisting of C1-C10 alkyl, halogen, —$OR^1$, —$SR^1$, —$C_1$-$C_4SR^1$, —$NO_2$, —CN and —$NR^aR^b$, wherein $R^1$ at each occurrence is independently hydrogen (H) or $C_1$-$C_4$ alkyl, and $R^a$ and $R^b$ are independently hydrogen or $C_1$-$C_4$ alkyl. In some embodiments, the positively charged N is a ring atom of an optionally substituted pyridine.

The ligand also contain a non-charged heteroatom coordinating to Cu. The heteroatom can be sp2 or sp3 hybridized. In some embodiments, the non-charged heteroatom is a ring atom of benzotriazole, wherein the benzotriazole is optionally substituted with one or more substituents selected from the group consisting of C1-C10 alkyl, halogen, —$OR^1$, —$SR^1$, —$C_1$-$C_4SR^1$, —$NO_2$, —CN and —$NR^aR^b$, wherein $R^1$ at each occurrence is independently hydrogen (H) or $C_1$-$C_4$ alkyl, and $R^a$ and $R^b$ are independently hydrogen or $C_1$-$C_4$ alkyl.

In some embodiments, the copper is coordinated to no more than 3 iodides. In some embodiments, the copper is coordinated to 3 iodides.

In some embodiments, the ligand is selected from the group consisting of 1-benzyl-1,4-diazabicyclo[2.2.2]octan-1-ium ((bz-ted), 1-(3-chloropropyl)-1,4-diazabi-cyclo[2.2.2]octan-1-ium ((3-Cl-pr-ted), 1-propyl-1,4-diazabicyclo[2.2.2]octan-1-ium (pr-ted), 1-(2-bromoethyl)-1,4-diazabicyclo[2.2.2]octan-1-ium (2-Br-et-ted), 1-isopropyl-1,4-diazabicyclo[2.2.2]octan-1-ium (i-pr-ted), 1-butyl-1,4-diazabicyclo[2.2.2]octan-1-ium ((bu-ted), 1-(1H-benzo[d][1,2,3]triazol-1-yl)-N,N,N-trimethylmethanamin-ium (bttmm), N-((1H-benzo[d][1,2,3]triazol-1-yl)methyl)-N,N-dimethyl ethanaminium (btmdme), N-((1H-benzo[d][1,2,3]triazol-1-yl)methyl)-N,N-dibutylbutan-1-aminium (btmdb), 3-(1H-benzo[d][1,2,3]triazol-1-yl)-N,N,N-trimethylpropan-1-aminium (bttmp), 5-(1H-benzo[d][1,2,3]triazol-1-yl)-N,N,N-trimethylpentan-1-aminium (bttmpe), 2-(1H-benzo[d][1,2,3]triazol-1-yl)-N,N,N-triethylethan-1-aminium (btte), 2-(1H-benzo[d][1,2,3]triazol-1-yl)-N,N,N-trimethylethan-1-aminium (bttme), 2-(1H-benzo[d][1,2,3]triazol-1-yl)-N- ethyl-N,N-dimethylethan-1-aminium (btedm), N-((1H-benzo[d][1,2,3]triazol-1-yl)methyl)-N,N-dimethylpropan-2-aminium (btmdp), 4-(1H-benzo[d][1,2,3]triazol-1-yl)-N,N,N-tri-methylbutan-1-aminium (bttmbu), and 6-(2H-benzo[d][1,2,3]triazol-2-yl)-N,N,N-tri-methylhexan-1-aminium (bttmhe).

In some embodiments, the phosphor compound is selected from the group consisting of $Cu_3I_5(bz\text{-}ted)_2$, $Cu_4I_6(3\text{-}Cl\text{-}pr\text{-}ted)_2$, $Cu_4I_6(pr\text{-}ted)_2$, $Cu_4I_6(2\text{-}Br\text{-}et\text{-}ted)_2$, $Cu_4I_6(i\text{-}pr\text{-}ted)_2$, $Cu_6I_8(bu\text{-}ted)_2$, $Cu_2I_4(mtp)_2$, $Cu_4I_6(tpp)_2(bttmm)_2$, $Cu_4I_6(tpp)_2(btmdme)_2$, $Cu_6I_8(btmdb)_2$, $0D\text{-}Cu_4I_6(me\text{-}ted)_2$, $0D\text{-}Cu_4I_6(me\text{-}ted)_2$, $0D\text{-}Cu_4I_6(et\text{-}ted)_2$, $0D\text{-}Cu_5I_7(i\text{-}bu\text{-}ted)_2$, $1D\text{-}Cu_2Br_3(bttmp)$, $1D\text{-}Cu_2I_3(bttmpe)$, $1D\text{-}Cu_2I_3(btte)$, $1D\text{-}Cu_4I_6(bttme)_2$, $1D\text{-}Cu_4I_6(btedm)_2$, $1D\text{-}Cu_6I_8(btmdp)_2$, $1D\text{-}Cu_6I_8(bttmbu)_2$, and $1D\text{-}Cu_6I_8(bttmhe)_2$.

Another aspect of the invention provides a light-emitting diode characterized by a die in conductive contact with an anode and a cathode. The die includes the phosphor compound.

Another aspect of the invention provides a method of emitting a visible light of red, green, yellow, orange, pink, or blue color. The method includes (a) placing a die formed from the phosphor compound of any one of claims 1-14 in conductive contact between an anode and a cathode within a reflective cavity; and (b) passing a current from the anode to the cathode.

Another aspect of the invention provides a method of preparing the phosphor compound. The method includes (a) providing a compound of CuX, wherein X is a halogen, (b) mixing said CuX with the ligand L in a solution; and (c) isolating said phosphor compound. In some embodiments, the method further includes introducing triphenylphosphine in step (b).

These and other aspects of the present invention will be described in greater detail below.

BRIEF DESCRIPTION OF THE DRAWINGS

FIG. 1(*b*) illustrates inorganic anionic cluster motifs and ligands (L1-L10) used to synthesize compounds 1-10. C and H atoms are omitted for clarity purpose. Color scheme: Cu, cyan; I, purple; N, blue; P, green; S, yellow.

DETAILED DESCRIPTION OF THE INVENTION

Figure 1:
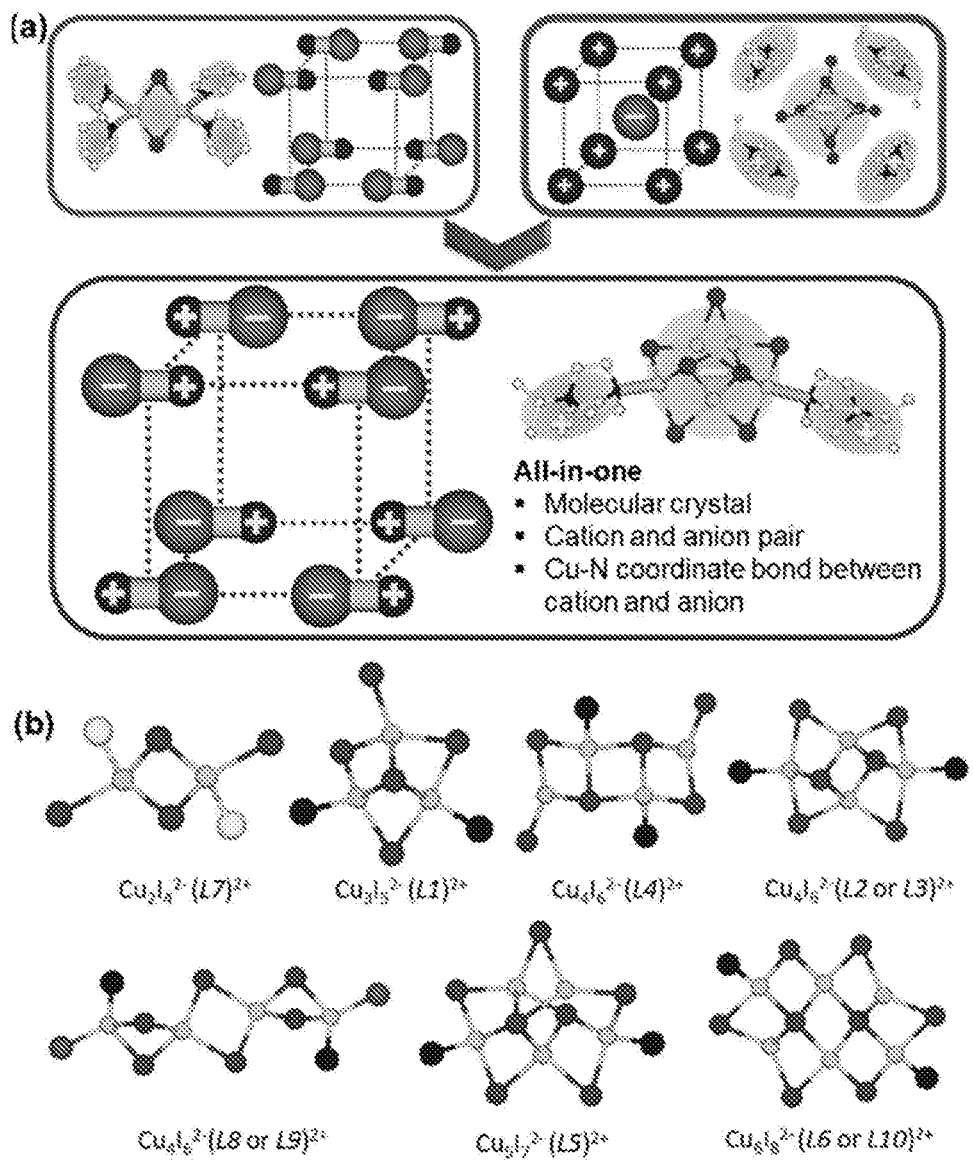
FIG. 1(*a*) illustrates the structure designing strategy for "all-in-one" type structures. Upper left: a conventional neutral CuI(L) molecular species with Cu—L dative bond only. Upper right: an ionic CuI(L) composed of ionic bond only. Bottom: "all-in-one" structure possessing both bonding types.

Various embodiments of the present invention provides a novel class of CuX (e.g. copper(I) halide) based inorganic-organic hybrid structures with excellent luminescence efficiency, structure stability, and solution processability. Compared to the molecular Copper (I) iodide clusters containing monodentate ligand (e.g. pyridine), both the photo and thermal stability of the new structures are significantly improved as a result of incorporating both ionic and coordinate bonds into the same structure.

The unique type of CuX-based hybrid structures include ionic and covalent (coordinate) bonds within a single molecular cluster. This unprecedented "all-in-one" (AIO) approach allows the creation of compounds bearing all three desired features: (i) being chemically and thermally robust (due to enhanced binding strength through two types of bonds); (ii) possessing the highest luminescence efficiency (as a result of inclusion of highly-emissive inorganic cluster core); and (iii) having excellent solution processability (because of their high solubility and/or easy dispersibility in common solvents inherent to their molecular identity).

While the following text may reference or exemplify specific components of a device or a method of utilizing the device, it is not intended to limit the scope of the invention to such particular references or examples. Various modifications may be made by those skilled in the art, in view of practical and economic considerations, such as the ligand and the method of preparing the compounds of the present invention.

The articles "a" and "an" as used herein refers to "one or more" or "at least one," unless otherwise indicated. That is, reference to any element or component of the present invention by the indefinite article "a" or "an" does not exclude the possibility that more than one element or component is present.

The term "about" as used herein refers to the referenced numeric indication plus or minus 10% of that referenced numeric indication.

The term "alkyl" as used herein include straight- and branched-chain and cyclic monovalent substituents. Examples include methyl, ethyl, propyl, isopropyl, and cyclopropyl. For example, the C1-C10 or C1-10 alkyl substituent may contain 1 to 10 carbon atoms such as propyl and hexyl.

The term "heteroaryl" as used herein refers to optionally-substituted aromatic monocyclic and fused bicyclic heterocycles containing one or more heteroatoms selected from N, O and S. non-limiting examples of heteroaryls include benzimidazole, benzisothiazole, benzisoxazole, benzofuran, benzothiazole, benzothiophene, benzotriazole, benzoxazole, carboline, cinnoline, furan, furazan, imidazole, indazole, indole, indolizine, isoquinoline, isothiazole, isoxazole, naphthyridine, oxadiazole, oxazole, phthalazine, pteridine, purine, pyran, pyrazine, pyrazole, pyridazine, pyridine, pyrimidine, pyrrole, quinazoline, quinoline, quinoxaline, tetrazole, thiadiazole, thiazole, thiophene, triazine, triazole, and N-oxides thereof.

The common features of these AIO compounds are: (i) they are molecular crystals; (ii) the inorganic modules are anionic and the organic ligands are cationic; (iii) the anionic $(Cu_mI_{m+n})^{n-}$ and the cationic $L^+$ are further connected by dative bonds.

As shown in FIG. 1a (bottom), a typical AIO structure contains an anionic inorganic module and a cationic organic ligand. The so-formed "ionic pair" is also bonded directly via a coordinate/dative bond between the metal (Cu) and ligand (L), generating an overall charge-neutral molecular complex.

The AIO type structures can be regarded as the combination of two structure types, as shown in FIG. 1a (upper left and right). In general, the pure ionic structures (no direct Cu—L bonds, "ligand-free", FIG. 1a, upper right) are thermally more stable than those of neutral species with Cu—L dative bonds (FIG. 1a, upper left), however, their optical emission is weak, with low luminescence internal quantum yields (IQYs). On the other hand, molecular clusters with Cu—L dative bonds exhibit the highest IQYs.

Suitable cationic ligands having free heteratoms binding sites are designed to build AIO structures. The cationic nature of the ligands will ensure the formation of ionic compounds with anionic inorganic modules, while the free binding sites enable their direct coordination to Cu atoms via dative bonds.

The phosphor cluster compound of the present invention generally has the formula of $Cu_mX_{m+n}(L)_n$. In some embodiments, each X anion is coordinated to one or more of the copper atoms. X can be for example fluoride, chloride, bromide, iodine, acetate, nitrate, and cyanide. In some embodiments the compound can include two different types of anions. In some embodiments, each X in the compound is independently fluoride, chloride, bromide or iodide. In some embodiments, X is I.

L is a cationic organic ligand having at least two heteroatoms such as N, O, S, and P. In some embodiments, the ligand is monocationic. One of the heteroatoms is a positively charged N and contributes to the cationic nature of the ligand. Another heteroatom of the ligand is coordinated to Cu. The subscript m is an integer selected from the group consisting of 1, 2, 3, 4, 5, 6, 7, 8, 9 and 10. The subscript n is 1, 2, 3, 4 or 5. In some embodiments, m is 2, 3, 4, 5, 6, 7 or 8, and n is 2. In some embodiments, the atoms of the compound are arranged to form a network having a 1D, 2D or 3D crystalline lattice structure.

The ligand contains a neutral heteroatom such as a non-charged N, O or S for coordinating to Cu and a nitrogen cation for pairing with the anionic moiety of the compound. Each of the neutral heteroatom and the nitrogen cation can be independently sp2 or sp3 hybridized.

In some embodiments, the nitrogen cation is sp3 hybridized in the form of a quaternary ammonium cation. The quaternary ammonium cation bears 4 substituents which can be same and different and each independently selected from alkyl, aryl, and heteroaryl. In some embodiments, all of the 4 carbons connected to the nitrogen cation are aliphatic. In some embodiments, 1, 2, 3 or 4 groups connected to the nitrogen are independently C1-C10 alkyls, each of the alkyls optionally substituted with one or more groups selected from halogen, —$OR^1$, —$SR^1$, —$C_1$-$C_4SR^1$, —$C_1$-$C_4$ alkyl, —$NO_2$, —CN and —$NR^aR^b$, wherein $R^1$ at each occurrence is independently hydrogen (H) or $C_1$-$C_4$ alkyl, and $R^a$ and $R^b$ are independently hydrogen or $C_1$-$C_4$ alkyl. Further, one or more carbons in the alkyls can be replaced with a heteroatom such as N, S, and O. In some embodiments, at least three groups of quaternary ammonium cation are alkyl groups independently selected from methyl, ethyl, isopropyl, butyl, said alkyls optionally substituted with one or more hydroxyl, chlorine or bromine.

In some embodiments, the nitrogen cation is sp2 hybridized. In some embodiments, the nitrogen is a ring atom of a heteroary which can be optionally substituted with one or more groups selected from halogen, —$OR^1$, —$SR^1$, —$C_1$-$C_4SR^1$, —$C_1$-$C_4$ alkyl, —$NO_2$, —CN and —$NR^aR^b$, wherein $R^1$ at each occurrence is independently hydrogen (H) or $C_1$-$C_4$ alkyl, and $R^a$ and $R^b$ are independently hydrogen or $C_1$-$C_4$ alkyl.

The ligand also contains a heteroatom (e.g. N, S, O or P) coordinating to Cu. In some embodiments, the heteroatom is a sp2 or sp3 hybridized nitrogen. In some embodiments, the heteroatom is a sp3 hybridized nitrogen. The three groups connecting to the nitrogen are independently selected from H, alkyl, aryl and heteroaryl.

In some embodiments, the heteroatom coordinating to Cu is a sp2 hybridized nitrogen as a ring atom of an optionally substituted heteroaryl. Non-limiting examples of heteroaryls include benzimidazole, benzisothiazole, benzisoxazole, benzofuran, benzothiazole, benzothiophene, benzotriazole, benzoxazole, carboline, cinnoline, furan, furazan, imidazole, indazole, indole, indolizine, isoquinoline, isothiazole, isoxazole, naphthyridine, oxadiazole, oxazole, phthalazine, pteridine, purine, pyran, pyrazine, pyrazole, pyridazine, pyridine, pyrimidine, pyrrole, quinazoline, quinoline, quinoxaline, tetrazole, thiadiazole, thiazole, thiophene, triazine, triazole and N-oxides thereof. In some embodiments, the heteroaryl moiety is pyridine or benzotriazole, which are optionally substituted. The optional substituents include one or more substituents selected from the group consisting of C1-C10 alkyl, halogen, —$OR^1$, —$SR^1$, —$C_1$-$C_4SR^1$, —$NO_2$, —CN and —$NR^aR^b$, wherein $R^1$ at each occurrence is independently hydrogen (H) or $C_1$-$C_4$ alkyl, and $R^a$ and $R^b$ are independently hydrogen or $C_1$-$C_4$ alkyl. In some embodiments, the heteroatom coordinating to Cu is a sp2 hybridized nitrogen of benzotriazole.

The positively charged N or the cation-containing heteroaryl and the neutral heteroatom coordinating to Cu can be connected via any type of spacer in the ligand. Examples of the spacer include $C_{1-10}$ alkyl, aryl, heteroaryl, and any combination thereof.

Examples of the ligand include 1-benzyl-1,4-diazabicyclo[2.2.2]octan-1-ium ((bz-ted), 1-(3-chloropropyl)-1,4-diazabicyclo[2.2.2]octan-1-ium ((3-Cl-pr-ted), 1-propyl-1,4-diazabicyclo[2.2.2]octan-1-ium (pr-ted), 1-(2-bromoethyl)-1,4-diazabicyclo [2.2.2]octan-1-ium (2-Br-et-ted), 1-isopropyl-1,4-diazabicyclo[2.2.2]octan-1-ium (i-pr-ted), 1-butyl-1,4-diazabicyclo[2.2.2]octan-1-ium ((bu-ted), 1-(1H-benzo[d][1,2,3]triazol-1-yl)-N,N,N-trimethylmethanaminium (bttmm), N-((1H-benzo[d][1,2,3]triazol-1-yl)methyl)-N,N-dimethyl ethanaminium (btmdme), N-((1H-benzo[d][1,2,3]triazol-1-yl)methyl)-N,N-dibutylbutan-1- aminium (btmdb), 3-(1H-benzo[d][1,2,3]triazol-1-yl)-N,N,N-trimethylpropan-1-aminium (bttmp), 5-(1H-benzo[d][1,2,3]triazol-1-yl)-N,N,N-trimethylpentan-1-aminium (bttmpe), 2-(1H-benzo[d][1,2,3]triazol-1-yl)-N,N,N-triethyl-ethan-1-aminium (btte), 2-(1H-benzo[d][1,2,3]triazol-1-yl)-N,N,N-trimethylethan-1-am-inium (bttme), 2-(1H-benzo[d][1,2,3]triazol-1-yl)-N-ethyl-N,N-dimethylethan-1-aminium (btedm), N-((1H-benzo[d][1,2,3]triazol-1-yl)methyl)-N,N-dimethylpropan-2-aminium (btmdp), 4-(1H-benzo[d][1,2,3]triazol-1-yl)-N,N,N-trimethylbutan-1-aminium (bttmbu), and 6-(2H-benzo[d][1,2,3]triazol-2-yl)-N,N,N-trimethyl-hexan-1-aminium (bttmhe).

The copper can be in a +1 or +2 oxidation state. In some embodiments, the oxidation state of Cu is +1 and the halogen is iodide. The excess halide coordinating to Cu leads to an anionic moiety of the compound. Each Cu can be coordinated to 2, 3 or 4 halides. In some embodiments, Cu is coordinated to only three halides or iodides. This unsaturated state of Cu represents a unique property of the phosphor compounds and allows it to coordinate to a ligand described herein. In some embodiments, m is selected from 2, 3, 4, 5, 6, 7 or 8, and n is 2. Exemplary compounds of the present invention includes $Cu_3I_5(bz\text{-}ted)_2$, $Cu_4I_6(3\text{-}Cl\text{-}pr\text{-}ted)2$, $Cu_4I_6(pr\text{-}ted)_2$, $Cu_4I_6(2\text{-}Br\text{-}et\text{-}ted)_2$, $Cu_4I_6(i\text{-}pr\text{-}ted)_2$, $Cu_6I_8(bu\text{-}ted)_2$, $Cu_2I_4(mtp)_2$, $Cu_4I_6(tpp)2(bttmm)_2$, $Cu_4I_6(tpp)_2(btmdme)_2$, $Cu_6I_8(btmdb)_2$, $0D\text{-}Cu_4I_6(me\text{-}ted)_2$, $0D\text{-}Cu_4I_6(me\text{-}ted)_2$, $0D\text{-}Cu_4I_6(et\text{-}ted)_2$, $0D\text{-}Cu_5I_7(i\text{-}bu\text{-}ted)_2$, $1D\text{-}Cu_2Br_3(bttmp)$, $1D\text{-}Cu_2I_3(bttmpe)$, $1D\text{-}Cu_2I_3(btte)$, $1D\text{-}Cu_4I_6(bttme)_2$, $1D\text{-}Cu_4I_6(btedm)_2$, $1D\text{-}Cu_6I_8(btmdp)_2$, $1D\text{-}Cu_6I_8(bttmbu)_2$, $1D\text{-}Cu_6I_8(bttmhe)_2$.

Figure 5:
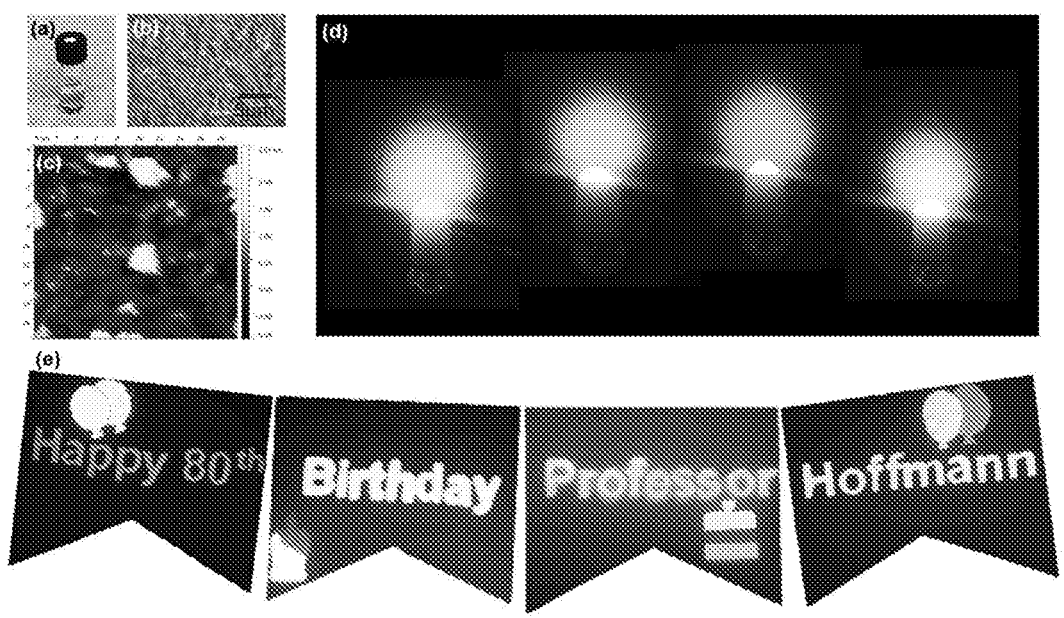
FIG. 5 illustrates (a) Image of compound 3 completely dissolved in DMF solution. (b) Bright-field micrograph image of the spin-coated film of 3. (c) AFM image of the thin film collected in tapping mode. (d) Illuminating LED light bulbs coated by selective AIO phosphors.

Under excitation of a suitable wavelength, the compounds of the present invention emit light of various colors as shown in FIG. 5. Accordingly, the compounds of the present invention can be configured into structures that are useful in the fabrication of electrical and optical devices by conventional means well known to those of ordinary skill in the art. For example, the compounds of the present invention can be manufactured into structures that function as quantum dots, quantum wells and quantum wires. Generally speaking, the compounds of the present invention find application in devices where the quantum confined structures are useful. These include, but are not limited to, interlayer dielectric devices in microelectronics, thermo-electric devices for cooling, beating and generating electricity, and quantum well laser structures useful in optoelectric devices for the generation or modulation of light radiation, including the modulation of light radiation for the transmission of information. The compounds of the present invention can also be used in infra-red photodetectors, lasers for spectroscopic and fiber optic applications, electroluminescent lasers and electronic phosphors. In particular, the compounds can be used in light-emitting devices to generate direct light of various colors.

Light emitting diodes (LEDs) based on the phosphor compounds of the present invention are prepared by substituting the phosphor compounds of the present invention for the phosphors conventionally used in the LED. That is, a chip (blue or UV or near UV) coated by the phosphors of the present invention is placed in conductive contact between an anode and a cathode within a reflective cavity. When the anode has a voltage that is more positive than its cathode by at least the LED's forward voltage drop, current flows. The phosphors absorb blue or UV or near-UV light and convert it to lower energy emission (e.g. yellow, orange or white light).

By changing the compound or adjusting the exciting wavelength, different light with emits black, red, green, yellow, orange, pink, gold or blue color is emitted. The phosphor compound displays intense luminescence with internal quantum yields (IQYs) greater than 40%, 50%, 60% or 70%.

A further aspect of the invention provides a method of preparing the phosphor compound. The method includes (a) providing a compound of CuX, wherein X is an anion (e.g. a halide), (b) mixing said CuX with the ligand L in a solution; and (c) isolating said phosphor compound. In some embodiments, the method further includes introducing triphenylphosphine in step (b). X and L are as defined above.

EXAMPLES

Materials. CuI (98%, Alfa Aesar); bulk methanol (98%, Alfa Aesar); dichloromethane (99+%, Alfa Aesar); 4-mercaptopyridine (>97%, Alfa Aesar); N,N-dimethylethylamine (99%, Sigma Aldrich); trimethylamine (45% w/w aq. soln., Alfa Aesar); formaldehyde (37% in aq. soln., Alfa Aesar); thionyl chloride (97%, Alfa Aesar); tributylamine (>98%, Alfa Aesar); 4,4'-dipyridyl disulfide (98%, TCI); 1,4-diazabicyclo[2.2.2]octane (>98%, TCI); benzimidazole (99%, Alfa Aesar); 1-iodopropane (98+%, Alfa Aesar); 1-iodobutane (99%, Alfa Aesar); 1-chloro-3-iodopropane (>98%, Alfa Aesar); 1-bromo-2-iodoethane (98%, Sigma Aldrich); 2-iodopropane (>99%, Alfa Aesar); benzyl bromide (>98%, TCI); sodium salicylate (99%, Merck), YAG:Ce3+ type 9800 (Global Tungsten & Powders Corp), PolyOx N750 (Dow Chemical).

Single crystal X-ray diffraction (SCXRD). Single crystal data of 1-10 were collected on a D8 goniostat equipped with a Bruker PHOTON100 CMOS detector at the Advanced Light Source (ALS), Lawrence Berkeley National Laboratory, using synchrotron radiation. The structures were solved by direct methods and refined by full-matrix least-squares on F2 using the Bruker SHELXTL package. These data can be obtained free of charge from The Cambridge Crystallographic Data Centre via www.ccdc.cam.ac.uk/data_request/cif. The structures were deposited in Cambridge Structural Database (CSD) with numbers: 1498474, 1529809-1529817.

Powder X-ray diffraction (PXRD) analysis. Powder X-ray diffraction (PXRD) analyses were carried out on a Rigaku Ultima-IV unit using Cu Kα radiation ($\lambda$=1.5406 Å). The data were collected at room temperature in a 2θ range of 3-50° with a scan speed of 1°/min. The operating power was 40 kV/40 mA.

Thermogravimetric analysis. Thermogravimetric analyses (TGA) of samples were performed using the TA Instrument Q5000IR thermal gravimetric analyzer with nitrogen flow and sample purge rate at 10 ml/min and 12 ml/min respectively. About 3 mg of samples were loaded onto a platinum sample pan and heated from room temperature to 400° C. at a rate of 10° C./min under nitrogen flow.

Room-temperature Photoluminescence measurements. Photoluminescence (PL) measurements were carried out on a Varian Cary Eclipse spectrophotometer. Powder samples were evenly distributed and sandwiched between two glass slides (which do not have emission in the visible range) for room temperature measurements.

Temperature dependent photoluminescence spectroscopy and lifetime measurements. Pressed pellets of 1 to 1.5 mm thickness were prepared in a 10 mm diameter die with the pressure of approximately 3000 psi. The pellets were sandwiched between two pieces of cover glass using a non-fluorescent double-sided tape (Bazic Product, permanent double-sided tape), and were mounted on the sample holder of a cryostat (Cryo Industries of America, Inc., Model 6NSVT Variable Temperature Optical Top-Loading Nitrogen Cryostat). A Cryo-con 32B Temperature Controller was used to precisely control the temperature of the sample chamber. An excitation wavelength of 380 nm (Spectra-Physics MaiTai BB Ti:Sapphire laser (pulse width<80 ps) with a frequency doubler) was used for all compounds. The laser repetition rate was set to 20 kHz or 10 kHz. The emission collected from the sample by a convex lens was separated and redirected by a 50/50 beam splitter. Half of the emission was collimated into a multimode optical fiber which is connected to a spectrometer for photoluminescence spectroscopy measurements. Another half of the collected emission went through a 550±44 nm band-pass filter to an APD detector for luminescence decay measurements. The decay data were recorded by TimeHarp 260 Nano (PicoQuant) with 2 or 1 ns resolution. The photoluminescence lifetimes of the different compounds at different temperatures were extracted by fitting the photoluminescence decay curves in OriginPro 9 with first- or second-order exponential decay functions with coefficient of determination (R2) values larger than 0.99.

Diffuse reflectance spectroscopy. Optical absorption spectra were measured at room temperature on a Shimadzu UV-3600 UV/VIS/NIR spectrometer. The reflectance data were converted to Kubelka-Munk function, $\alpha/S=(1-R)2/2R$ ($\alpha$ is absorption coefficient, S is scattering coefficient and R is reflectance), and used to estimate the bandgap. The scattering coefficient (S) was treated as a constant as the average particle size of the samples used in the measurements was significantly larger than 5 µm. Samples for reflectance measurements were prepared by evenly distributing ground powder sample between two quartz slides.

Internal quantum yield measurements. Internal quantum yield (IQY) measurements were made on C9920-02 absolute quantum yield measurement system (Hamamatsu Photonics) with 150 W xenon monochromatic light source and 3.3 inch integrating sphere. Samples for internal quantum yield measurements were prepared by spreading fine powder samples evenly on the bottom of a quartz sample holder. Sodium salicylate (SS) and YAG:Ce3+ were chosen as the standards with reported IQY values of 60% and 95% at an excitation energy of 360 nm and 450 nm, respectively. Their IQY values were measured to be 66% and 101%, respectively and corrections were made based on the reported data.

Film preparation. Compound 3 (25 mg) was dissolved in DMF (50 mL) and sonicated for 2 h to form a clear yellow solution. The solution was filtered through a polyvinylidene fluoride (PVDF) microfiltration membrane (0.45 µm) before use. The solution was then spin-coated onto a glass substrate (pre-heated to 90° C. to promote the removal of the solvent) with a speed of 1500 rpm for 90 seconds, and the spin coating procedure was repeated for 10 times, followed by a thermal annealing at 110° C. for 2 h.

Film characterization. The continuity of the film was characterized by reflection-mode bright-field (BF) optical microscopy (Nikon Optiphot 66) (FIG. 5b). Dark-field (DF) reflection images were acquired to study the roughness of the film and the images were also obtained through optical microscopy but in dark-field mode. A 75 W Xenon bulb was used as the illumination source. The BF scattering image was collected using 100× bright-field objectives and set to a color CCD camera using the exposure time 200 ms, gain 0 and 100% saturation. PXRD pattern was taken directly of the film with the glass substrate. Surface morphology and thickness of the films were investigated on an atomic force microscope (AFM) in Nanoscope IV (Digital Instruments) in tapping mode (standard cantilevers with spring constant of 40 N/m and tip curvature<10 nm) with a scan speed of 5 µm/s.

Design and fabrication of prototype LED bulbs. Selected phosphors were dispersed in binder/ethanol solution, and were uniformly coated on to glass bulbs. The bulbs were placed on top of LED lamps with UV chips (110 V, 2 W, 365 nm) as the excitation source. For white light bulbs, blue light chip (110 V, 1.5 W, 450 nm) was used.

Cationic N/S-ligands were synthesized by alkylation of tertiary amine group of selected ligands via Menshutkin reactions. Three types of synthetic approaches (I, II and III) as shown in more details below were designed, from which ten cationic ligands were prepared, including one formed in-situ. Direct reactions of the ligands with CuI led to the formation of ten new AIO type compounds. In some cases, triphenylphosphine (tpp) was also introduced as terminal ligands to prevent formation of high dimensional inorganic modules such as chains or layers. All compounds are molecular species containing inorganic clusters of various compositions (FIG. 1b) with the following formulae: $Cu_3I_5(L1)_2$ (1), $Cu_4I_6(L2)_2$ (2), $Cu_4I_6(L3)_2$ (3), $Cu_4I_6(L4)_2$ (4), $Cu_5I_7(L5)_2$ (5), $Cu_6I_8(L6)_2$ (6), $Cu_2I_4(L7)_2$ (7), $Cu_4I_6(tpp)_2(L8)_2$ (8), $Cu_4I_6(tpp)_2(L9)_2$ (9), and $Cu_6I_8(L10)_2$ (10).

Ligand Synthesis and Characterizations

General design of ligand synthesis. Three types of reactions were planned to synthesize cationic ligands. In Reaction I alkalation occurs at one of the tertiary N site of a bidentate N-ligand (e.g. triethylenediamine). The unalkylated N atom serves as binding site for Cu metal. In reaction II, alkylation takes place at the aromatic N while S atom acts as a binding site for Cu. While these reactions involve a single step. Reaction III is a two-step process, where alkylation happens at the NH site of an N-heterocyclic ring, making aromatic N atom available for binding to Cu metal center. Bidentate triethylenediamine (ted), 4-mercaptopyridine (4-SH-py), and benzotriazole (bta) derivatives were selected as starting ligands for route I, II and III, respectively.

Synthetic approach I, II and III used to prepare cationic ligands with free binding sites marked in bold.

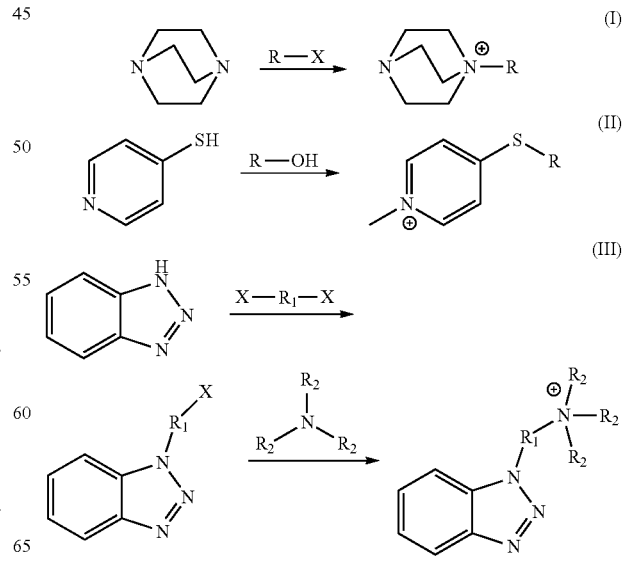

Selected cationic organic ligands were prepared (L1-L10 of FIG. 1(b)) following reported procedures with some modifications.

Preparation of 1-benzyl-1,4-diazabicyclo[2.2.2]octan-1-ium (bz-ted, L1). Ted (1.12 g, 10 mmol) was first dissolved in acetone (50 ml) upon sonication and benzyl bromide (1.44 g, 10 mmol) was added dropwise into it under magnetic stirring. The solution remained clear after the mixing and white precipitate formed in a few hours. The precipitate was collected by filtration, washed with ethyl acetate, and dried under vacuum. The yield was 87%.

Preparation of 1-(3-chloropropyl)-1,4-diazabicyclo[2.2.2]octan-1-ium (3-Cl-pr-ted, L2). Ted (1.12 g, 10 mmol) was dissolved in acetone (50 ml) upon sonication and 1-chloro-3-iodopropane (2.04 g, 10 mmol) was added slowly in it under magnetic stirring. The solution was stirred for two hours and the white precipitate formed was collected by filtration, washed with ethyl acetate and dried under vacuum. Yield was 67%.

Preparation of 1-propyl-1,4-diazabicyclo[2.2.2]octan-1-ium (pr-ted, L3). Ted (1.12 g, 10 mmol) was first dissolved in acetone (50 ml) upon sonication and 1-iodopropane (1.70 g, 10 mmol) was added dropwise into it under magnetic stirring. The solution remained clear after the mixing and white precipitate formed in an hour. The precipitate was collected by filtration, washed with ethyl acetate, and dried under vacuum. The yield was 68%.

Preparation of 1-(2-bromoethyl)-1,4-diazabicyclo[2.2.2]octan-1-ium (2-Br-et-ted, L4). 1-Bromo-2-iodoethane (2.34 g, 10 mmol) was added dropwise into acetone (50 ml) containing ted (1.12 g, 10 mmol) under magnetic stirring. White precipitate formed in a few hours, and the precipitate was collected by filtration, washed with ethyl acetate, and dried under vacuum. The yield was 70%.

Preparation of 1-isopropyl-1,4-diazabicyclo[2.2.2]octan-1-ium (i-pr-ted, L5). Ted (1.12 g, 10 mmol) was first dissolved in acetone (50 ml) upon sonication and 2-iodopropane (1.70 g, 10 mmol) was added dropwise into it under magnetic stirring. The white precipitate formed in one day. The precipitate was collected by filtration, washed with ethyl acetate, and dried under vacuum. The yield was 75%.

Preparation of 1-butyl-1,4-diazabicyclo[2.2.2]octan-1-ium (bu-ted, L6). Ted (1.12 g, 10 mmol) was first dissolved in acetone (50 ml) upon sonication and 1-iodobutane iodobutane (1.84 g, 10 mmol) was added dropwise into it under magnetic stirring. White precipitate formed within an hour. The precipitate was collected by filtration, washed with ethyl acetate, and dried under vacuum. The yield was 80%.

Preparation of (1H-benzo[d][1,2,3]triazol-1-yl)methanol (btm). A mixture of bta (3.4 g, 0.025 mol), distilled water (50 ml), and formaldehyde solution (37%, 10 ml) was first refluxed for 1.5 hours. After cooling to room temperature, the resulting white precipitate was collected by filtration, washed with water and dried under vacuum to give the corresponding 1H-benzotriazol-1-yl-methanol(btm).

Preparation of 1-(chloromethyl)-1H-benzo[d][1,2,3]triazole (Cl-mbt). Btm (3.7 g, 0.025 mol) was dissolved in a mixture of CH2Cl2 (60 ml) and dimethylformamide (DMF) (40 ml) and thionyl chloride (5 ml) in methylene chloride (10 ml) was added dropwise into it under magnetic stirring at room temperature. The reaction mixture was kept stirring for 2 h at room temperature, then its pH was adjusted by NaHCO3 saturated solution to 7. The organic layer was separated and was evaporated under reduced pressure, giving white crystalline powder as 1-(chloromethyl)-1H-benzotriazole (Cl-mbt).

Preparation of 1-(1H-benzo[d][1,2,3]triazol-1-yl)-N,N,N-trimethylmethan-aminium (bttmm, L8). Cl-mbt (3.8 g, 0.025 mol) was then fully dissolved in acetone (20 ml) and KI (5 g) was added. The reaction mixture was kept under stirring for 2 h before the solution was filtered. The filtrate was then added with trimethylamine (2 ml) and precipitate was formed after stirring at room temperature overnight. The white precipitate was filtered, washed with acetone and dried under vacuum as the final product.

Preparation of N-((1H-benzo[d][1,2,3]triazol-1-yl)methyl)-N,N-dimethyl ethanaminium (btmdme, L9). Cl-mbt (3.8 g, 0.025 mol) was first dissolved in acetone (20 ml) and KI (5 g) was added. The reaction mixture was kept under stirring for 2 h and the solution was filtered. The filtrate was added with N,N-dimethylethylamine (1 ml) and precipitate formed after stirring at room temperature overnight. The white precipitate was filtered, washed with acetone and dried under vacuum as the final product.

Preparation of N-((1H-benzo[d][1,2,3]triazol-1-yl)methyl)-N,N-dibutylbutan-1-aminium (btmdb, L10). Cl-mbt (3.8 g, 0.025 mol) was first dissolved in acetone (20 ml) and KI (5 g) was added. The reaction mixture was kept under stirring for 2 h before the solution was filtered. The filtrate was added with tributylamine (1 ml) and the precipitate was formed after stirring at room temperature overnight. The white precipitate was filtered, washed with acetone and dried under vacuum as the final product.

Crystallographic data, crystal images, structural plots and synthetic procedures of compounds 1-10 are summarized in Tables 1 and 2.

TABLE 1

Summary of crystal data of compounds 1-5.

| Compound | $Cu_3I_5$(bz-ted)$_2$ (1) | $Cu_4I_6$(3-Cl-pr-ted)$_2$ (2) | $Cu_4I_6$(pr-ted)$_2$ (3) | $Cu_4I_6$(2-Br-et-ted)$_2$ (4) | $Cu_4I_6$(i-pr-ted)$_2$ (5)$^a$ |
|---|---|---|---|---|---|
| Empirical Formula | $C_{26}H_{38}Cu_3I_5N_4$ | $C_{18}H_{36}Cl_2Cu_4I_6N_4$ | $C_{18}H_{38}Cu_4I_6N_4$ | $C_{16}H_{32}Br_2Cu_4I_6N_4$ | $C_{22}H_{44}Cu_5I_7N_6$ |
| FW | 1231.72 | 1394.97 | 1326.08 | 1455.83 | 1598.63 |
| Space Group | Pna2$_1$ | Pbca | Pbca | P2$_1$/c | Cc |
| a (Å) | 24.0270(11) | 13.6462(7) | 14.6937(12) | 7.3080(3) | 8.7546(4) |
| b (Å) | 9.7647(5) | 14.8791(7) | 14.4893(12) | 16.7452(7) | 32.8070(13) |
| c (Å) | 14.1939(7) | 15.8035(8) | 14.7546(12) | 13.0857(6) | 13.9970(6) |
| α (°) | 90 | 90 | 90 | 90 | 90 |
| β (°) | 90 | 90 | 90 | 91.875(2) | 104.049(2) |
| γ (°) | 90 | 90 | 90 | 90 | 90 |
| V (Å$^3$) | 3330.1(3) | 3208.8(3) | 3141.3(4) | 1600.49(12) | 1598.63 |
| Z | 4 | 4 | 4 | 2 | 4 |

TABLE 1-continued

Summary of crystal data of compounds 1-5.

| Compound | $Cu_3I_5(bz\text{-}ted)_2$ (1) | $Cu_4I_6(3\text{-}Cl\text{-}pr\text{-}ted)_2$ (2) | $Cu_4I_6(pr\text{-}ted)_2$ (3) | $Cu_4I_6(2\text{-}Br\text{-}et\text{-}ted)_2$ (4) | $Cu_4I_6(i\text{-}pr\text{-}ted)_2$ (5)[a] |
|---|---|---|---|---|---|
| T (K) | 100(2) | 100(2) | 100(2) | 298(2) | 100(2) |
| λ (Å) | 0.7749 | 0.7749 | 0.7749 | 0.7749 | 0.7749 |
| $R_1$ | 0.0241 | 0.0170 | 0.0224 | 0.0349 | 0.0217 |
| $wR_2$ | 0.0573 | 0.0409 | 0.0553 | 0.0918 | 0.0487 |

[a] Acetonitrile molecule was removed for the formulation consistency.

TABLE 2

Summary of crystal data of compounds 6-10.

| Compound | $Cu_6I_8(bu\text{-}ted)_2$ (6) | $Cu_2I_4(mtp)_2$ (7) | $Cu_4I_6(tpp)_2(bttmm)_2$ (8) | $Cu_4I_6(tpp)_2(btmdme)_2$ (9) | $Cu_6I_8(btmdb)_2$ (10) |
|---|---|---|---|---|---|
| Empirical Formula | $C_{20}H_{42}Cu_6I_8N_4$ | $C_{14}H_{20}Cu_2I_4N_2S_2$ | $C_{56}H_{60}Cu_4I_6N_8P_2$ | $C_{58}H_{64}Cu_4I_6N_8P_2$ | $C_{38}H_{66}Cu_6I_8N_8$ |
| FW | 1735.01 | 915.12 | 1922.62 | 1950.67 | 2031.42 |
| Space Group | $P2_1/n$ | Pbca | P-1 | P-1 | $P2_1/n$ |
| a (Å) | 14.0654(8) | 14.1350(5) | 9.4270(5) | 9.4759(4) | 20.0887(7) |
| b (Å) | 9.6542(6) | 11.2250(4) | 9.7963(6) | 9.8097(4) | 14.0472(5) |
| c (Å) | 15.3742(9) | 14.4830(5) | 19.2714(11) | 19.4737(8) | 21.1752(8) |
| α (°) | 90 | 90 | 95.637(2) | 97.104(2) | 90 |
| β (°) | 110.977(2) | 90 | 94.470(2) | 93.506(2) | 109.720(2) |
| γ (°) | 90 | 90 | 118.055(2) | 117.500(2) | 90 |
| V (Å³) | 1949.3(2) | 2297.95(14) | 1547.30(16) | 1578.89(12) | 5625.0(4) |
| Z | 2 | 4 | 1 | 1 | 4 |
| T (K) | 100(2) | 150(2) | 100(2) | 100(2) | 100(2) |
| λ (Å) | 0.7749 | 0.6888 | 0.7749 | 0.7293 | 0.7293 |
| $R_1$ | 0.0213 | 0.0162 | 0.0295 | 0.0259 | 0.0327 |
| $wR_2$ | 0.0477 | 0.0345 | 0.0746 | 0.0633 | 0.0600 |

Synthesis of 1. CuI (0.19 g, 1 mmol) was first dissolved in KI saturated solution (2 ml) in a reaction vial. Acetonitrile (2 ml) was added as another layer and then the ligand (1 mmol) in methanol (2 ml) was added slowly in to the vial. The reaction mixture was kept undisturbed at room temperature, and rod-shaped single crystals formed in one day and were collected by filtration.

Synthesis of 2. Acetonitrile (2 ml) was added into KI saturated solution (2 ml) containing CuI (0.19 g, 1 mmol), and then the ligand (1 mmol) in methanol (2 ml) was slowly added. Rod-shaped single crystals formed in one day and collected by filtration.

Synthesis of 3. Plate like crystals of 3 were prepared similarly as that of 1. Pure phase of powder samples could be synthesized by direct mixing of CuI in acetonitrile with ligand in methanol. Precipitate formed immediately and was collected by filtration.

Synthesis of 4. Compound 4 were prepared similarly as that of 1. Rod-shaped crystals were formed in 3 days and were collected by filtration.

Synthesis of 5. Compound 5 was prepared in the same way as that of 1. Rod like single crystals formed in 3 days.

Synthesis of 6. Compound 6 was synthesized by the method similar as that of 1. Plate-shaped colorless single crystals could be obtained in 1 day.

Synthesis of 7. Compound 7 was prepared by the solvothermal reaction of CuI, KI, 4-mercaptopyridine and methanol in a molar ratio of 1:6:2:1:300 at 150° C. for 48 h. pH of the reaction mixture were adjusted by 1M of HCl to 2. Large amount of yellowish crystalline powder of 7 with the yield of 71% was generated. Rod-shaped crystals suitable for single-crystal X-ray analyses were together with the powder and were separated for structure determination.

Synthesis of 8. 0D-Cu2I2(tpp)3 (0.1 g) was first well dispersed in a mixture of toluene (2 ml) and CH2Cl2 (2 ml), and then was mixed with the ligand (0.1 g) in methanol (2 ml). The mixture was heated at 80° C. for 2 days, which afforded greenish crystalline powder along with plate-shaped single crystals.

Synthesis of 9. Yellowish rock shaped single crystals were obtained under the similar condition as that of 8.

Synthesis of 10. Saturated KI solution (2 ml) containing CuI (0.19 g, 1 mmol) was mixed with methanol (2 ml) containing the ligand (8 mmol). Then acetone (5 ml) was added and the reaction mixture was kept in the open air for the solvent to slowly evaporate. Yellowish rhombohedral-shaped single crystals formed in 3 days and were collected by filtration.

TABLE 3

Shortest Cu—Cu distances in compounds 1-10.

| Structures | Cu—Cu distance (Å) |
|---|---|
| $Cu_3I_5(bz\text{-}ted)_2$ (1) | 2.61, 2.66 |
| $Cu_4I_6(3\text{-}Cl\text{-}pr\text{-}ted)_2$ (2) | 2.56, 2.74 |
| $Cu_4I_6(pr\text{-}ted)_2$ (3) | 2.64, 2.70 |
| $Cu_4I_6(2\text{-}Br\text{-}et\text{-}ted)_2$ (4) | 2.64, 3.05 |
| $Cu_5I_7(i\text{-}pr\text{-}ted)_2$ (5) | 2.71, 2.72 |
| $Cu_6I_8(bu\text{-}ted)_2$ (6) | 2.61, 2.71 |
| $Cu_2I_4(mtp)_2$ (7) | 2.86 |
| $Cu_4I_6(tpp)_2(bttmm)_2$ (8) | 3.01, 3.29 |
| $Cu_4I_6(tpp)_2(btmdme)_2$ (9) | 3.06, 3.47 |
| $Cu_6I_8(btmdb)_2$ (10) | 2.62, 2.63 |

TABLE 4

Lifetime values of 3 at various temperatures.

| Temperature (K) | Lifetime τ (µs) |
|---|---|
| 77 | 7.12 |
| 150 | 6.50 |
| 200 | 6.26 |
| 273 | 5.33 |
| 295 | 4.94 |

TABLE 5

Lifetime values of 6 at various temperatures.

| Temperature (K) | Lifetime τ (µs) |
|---|---|
| 77 | 6.55 |
| 150 | 6.95 |
| 200 | 7.08 |
| 273 | 6.04 |
| 295 | 5.73 |

TABLE 6

Lifetime values of 8 at various temperatures.

| Temperature (K) | Average Amplitude Weighted τ (µs) | τ1 (µs) | τ2 (µs) |
|---|---|---|---|
| 77 | 22.99 | 3.85 (20.3%) | 27.87 (79.7%) |
| 150 | 9.71 | 2.47 (17.0%) | 11.14 (83.0%) |
| 200 | 5.78 | 1.78 (19.7%) | 6.76 (80.3%) |
| 273 | 2.31 | 0.58 (20.1%) | 3.14 (69.9%) |
| 295 | 1.29 | 0.38 (48.6%) | 2.16 (51.4%) |

TABLE 7

Lifetime values of 10 at various temperatures.

| Temperature (K) | Average Amplitude Weighted τ (µs) | τ1 (µs) | τ2 (µs) |
|---|---|---|---|
| 77 | 24.38 | 4.85 (13.5%) | 27.43 (86.5%) |
| 150 | 9.76 | 3.44 (24.3%) | 11.79 (75.7%) |
| 200 | 6.08 | 2.12 (12.3%) | 6.64 (87.7%) |
| 273 | 1.91 | 0.52 (31.2%) | 2.57 (68.2%) |
| 295 | 1.61 | 0.49 (29.9%) | 2.09 (70.1%) |

DFT Calculations on Selective AIO Type Compounds

DFT calculations were performed to optimize the geometries and calculate the optical band gaps and density of states of the AIO type compounds 1, 3, 7 and 8, with initial geometries obtained from experimental crystal structures. The systems have periodic structures and each structure has between 176 and 512 atoms in the primitive cell. We adopted the PBE0 functional, the PBE norm-conserving pseudopotentials and a Plane-Wave basis set for the calculations using the Quantum Espresso software package. The PBE0 hybrid functional was used because the LDA or GGA functionals alone underestimates the band gaps. We used 46 Ry for the plane-wave kinetic energy cutoff, and found that increasing the cutoff by 2 to 3 times only changes the calculated band gaps by <0.01 eV for all the AIO type compounds studied. For geometry optimizations, a quasi-Newton algorithm was used with a convergence threshold of 10-3 Ry/Bohr, and the Brillouin-zone integration was sampled with Γ (gamma) k-points with a Gaussian broadening of 0.005 Ry.

The calculated band gaps for the four AIO type compounds are listed in Table 8, along with the experimentally estimated values. The calculations correctly captured the trend that compounds in sub-group I have higher band gaps than those in sub-group II, although the calculated values are systematically lower than experiment by about 0.7 eV. This error range is consistent with recent calculations on a series of semiconductors and insulators using hybrid functionals. The main contributions from the atomic orbitals to the valence band maximum (VBM) and the conduction band minimum (CDM) are shown in Table 9 and 10, respectively.

TABLE 8

Calculated and experimentally estimated band gap values for selected AIO type compounds.

| Compound | Calculated B.G. (eV) | Experimentally estimate B.G. (eV) |
|---|---|---|
| $Cu_4I_6(pr\text{-}ted)_2$ (3) | 2.3 | 3.0 |
| $Cu_5I_7(i\text{-}pr\text{-}ted)_2$ (5) | 2.4 | 3.0 |
| $Cu_2I_4(mtp)_2$ (7) | 1.8 | 2.3 |
| $Cu_4I_6(tpp)_2(bttmm)_2$ (8) | 1.8 | 2.5 |

TABLE 9

Main contributions from atomic orbitals to the valence band maximum (VBM) region (energy range: 0.5 eV).

| atomic orbitals | compounds | | | |
|---|---|---|---|---|
| | $Cu_4I_6(pr\text{-}ted)_2$ (3) | $Cu_5I_7(i\text{-}pr\text{-}ted)_2$ (5) | $Cu_2I_4(mtp)_2$ (7) | $Cu_4I_6(tpp)_2(bttmm)_2$ (8) |
| VBM (eV) | −1.65~−1.15 | −1.7~−1.2 | −1.4~−0.9 | −1.4~−0.9 |
| Cu(3d) | 54.6% | 56.5% | 47.0% | 51.3% |
| I(5p) | 18.4% | 29.1% | 31.4% | 32.6% |
| Cu(4p) | 7.2% | 1.2% | 1.2% | 3.4% |
| I(5d) | 6.7% | 3.0% | 4.7% | 6.3% |

TABLE 10

Main contributions from atomic orbitals to the conduction band minimum (CBM) region (energy range: 0.5 eV).

| atomic orbitals | compounds | | | |
|---|---|---|---|---|
| | $Cu_4I_6(pr\text{-}ted)_2$ (3) | $Cu_5I_7(i\text{-}pr\text{-}ted)_2$ (5) | $Cu_2I_4(mtp)_2$ (7) | $Cu_4I_6(tpp)_2(bttmm)_2$ (8) |
| CBM (eV) | 1.15~1.65 | 1.2~1.7 | 0.9~1.4 | 0.9~1.4 |
| I(5d) | 14.3% | 8.8% | 2.7% | 3.6% |
| Cu(4s) | 2.4% | 0.5% | 0.5% | 0.8% |
| I(5p) | 20.4% | 17.3% | 3.0% | 3.3% |
| N(2s) | 0.2% | 0.0% | 0.0% | 0.5% |
| C(2p) | 1.2% | 0.4% | 56.6% | 28.8% |
| N(2p) | 0.2% | 0.1% | 17.7% | 46.4% |
| Cu(4p) | 16.5% | 4.4% | 0.3% | 2.4% |
| Cu(3d) | 35.0% | 60.0% | 1.9% | 7.6% |

TABLE 11

Comparison of the four types of copper iodide based hybrid phosphors.

| Sub-family | Formula | Optical tunability | High IQYs | High stability | High dispersibility |
|---|---|---|---|---|---|
| I | CuI(L) | ✓ | X | X | X |
| II | $Cu_2I_2(L)_n$ | ✓ | ✓ | X | X |
| III | $Cu_4I_4(L)_n$ | X | ✓ | ✓ | X |
| IV | $Cu_mI_{m+n}(L)_n$ | ✓ | ✓ | ✓ | ✓ |

New AIO structures with the general formula of 0D-$Cu_mI_{m+n}(L)_n$ (L=cationic organic ligand) were thus synthesized and structurally characterized. Crystal structure analysis reveals that direct coordinate/dative bonds are formed between the free binding atom (either N or S) of the cationic ligand and Cu atom of the anionic cluster for all 10 structures. Based on the types of binding atoms these compounds can be categorized into two sub-groups. For sub-group I compounds (1-6) the N atom directly bonded to metal has a $sp^3$ electron configuration (part of the aliphatic ring), whereas the coordinating N atom of the ligands in sub-group II compounds (8-10) has a $sp^2$ configuration (part of the aromatic ring, Table 12). The S atom in compound 7 does not belong to a ring. It is included in sub-group II based on its similar emission behavior to sub-group II members.

Different from molecular crystals made of neutral inorganic modules, which are limited to a small group of clusters such as CuI monomers, Cu2I2 dimers, or Cu4I4 tetramers, a large variety of anionic inorganic modules can be obtained using similar ligands, offering a remarkably rich structural variation for this type of compounds. Among 10 structures included here, 7 different clusteres are identified, from dimer (Cu2) to hexamer (Cu6), most of which are discovered for the first time (FIG. 1b). In addition, some of them have the same composition but are structurally different, adding yet another degree of diversity towards this family. For example, compounds 3, 4, and 8 all contain $(Cu_4I_6)^{2-}$, but their structures are very different (FIG. 1b). Structures with identical inorganic modules but coordinated to different ligands have also been obtained, such as 2 and 3; 8 and 9; and 6 and 10. Different from neutral molecular species where each Cu atom has tetrahedral coordination and bonds to at least one ligand molecule, some Cu atoms in ionic compounds are coordinated only to three iodine. The unsaturated coordination of Cu atoms is a unique property of this family.

All of these structures display intense luminescence with internal quantum yields (IQYs) greater than 60%. Some are as high as 92% (Table 12). The previously reported ted based "ligand-free" ionic structures, on the other hand, are all poor emitters. $Cu_4I_8(di\text{-}et\text{-}ted)_2$ (di-et-ted=1,4-diethyl-1,4-diaz-abicyclo[2.2.2]octane-1,4-diium), for example, gives a very weak yellow-orange emission (FIG. 2a) with a IQY (2%) that is incomparably lower. Such differences suggest that metal-ligand bonds play a vital role in the electron transfer process upon excitation of these compounds.

Figure 6:
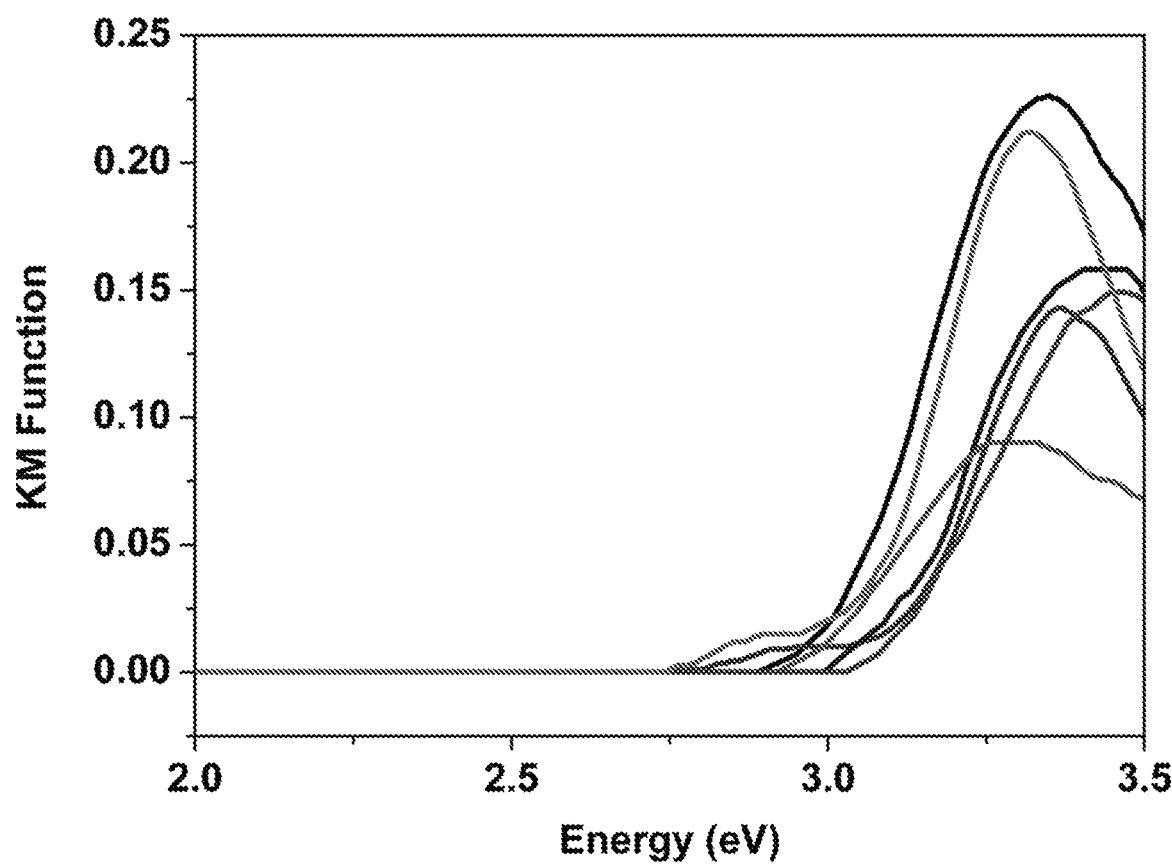
FIG. 6 illustrates Optical absorption spectra of compounds in sub group (I). 1 (black), 2 (red), 3 (blue), 4 (green), 5 (pink), 6 (gold).
Figure 7:
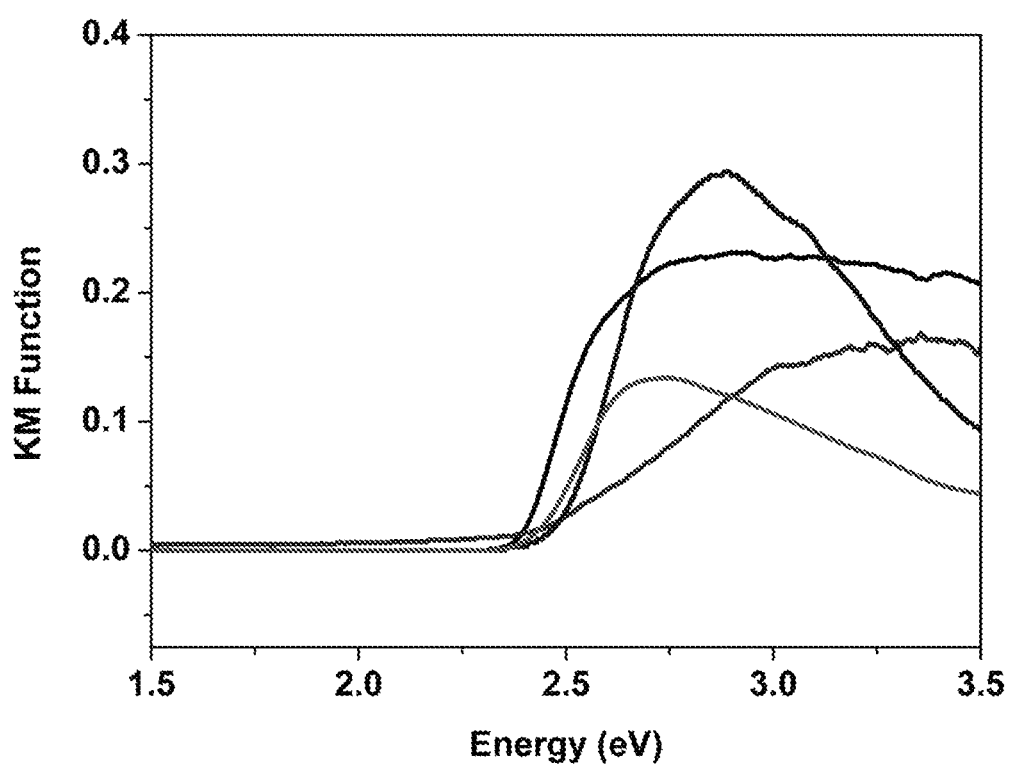
FIG. 7 illustrates Optical absorption spectra of compounds in sub group (II). 7 (black), 8 (red), 9 (blue), 10 (green).
Figure 8:
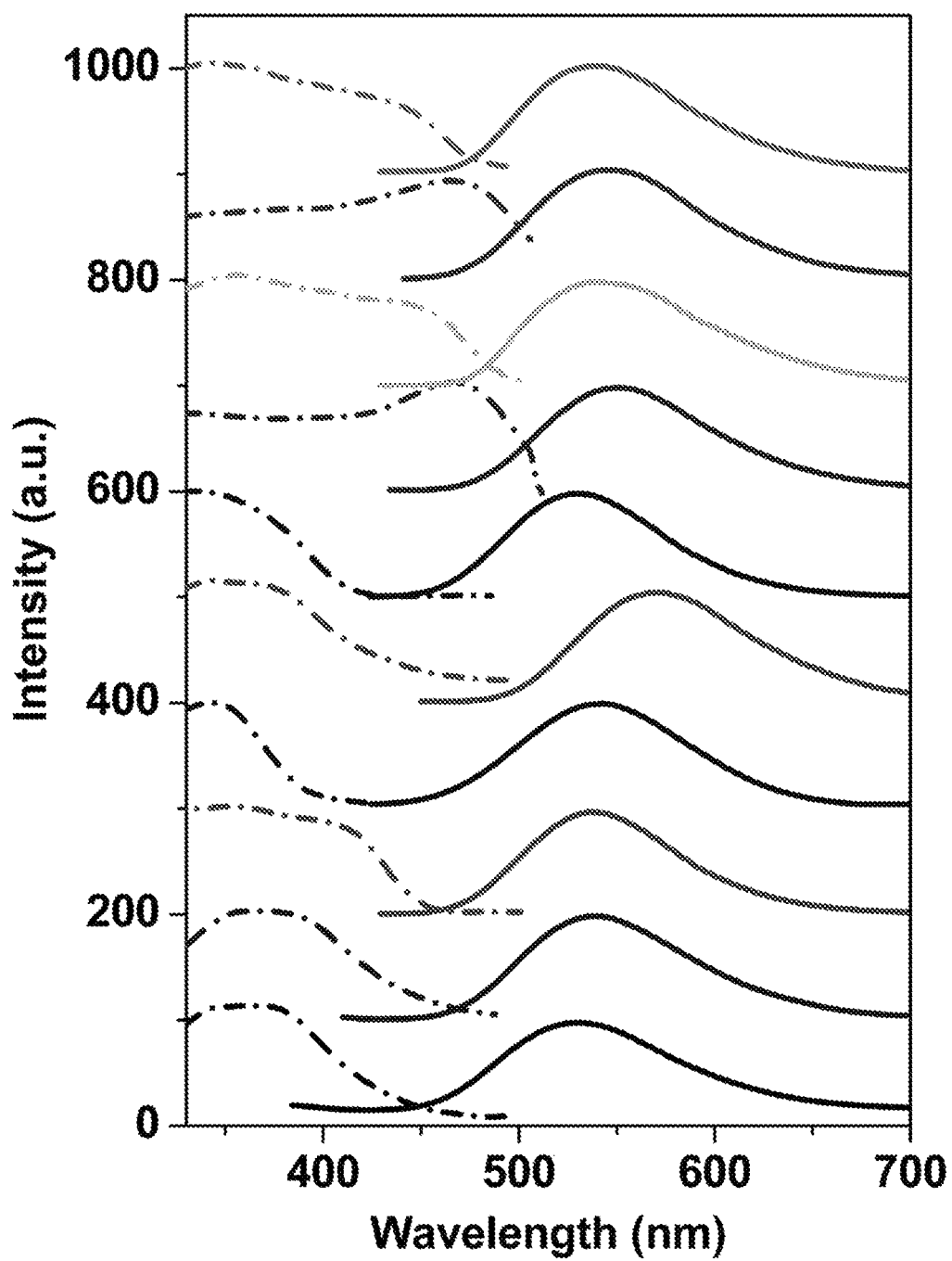
FIG. 8 illustrates excitation and emission spectra of compounds 1-10. Solid line: emission spectra, λex=360 nm; dotted line: excitation spectra. From bottom to top: 1-10.
Figure 9:
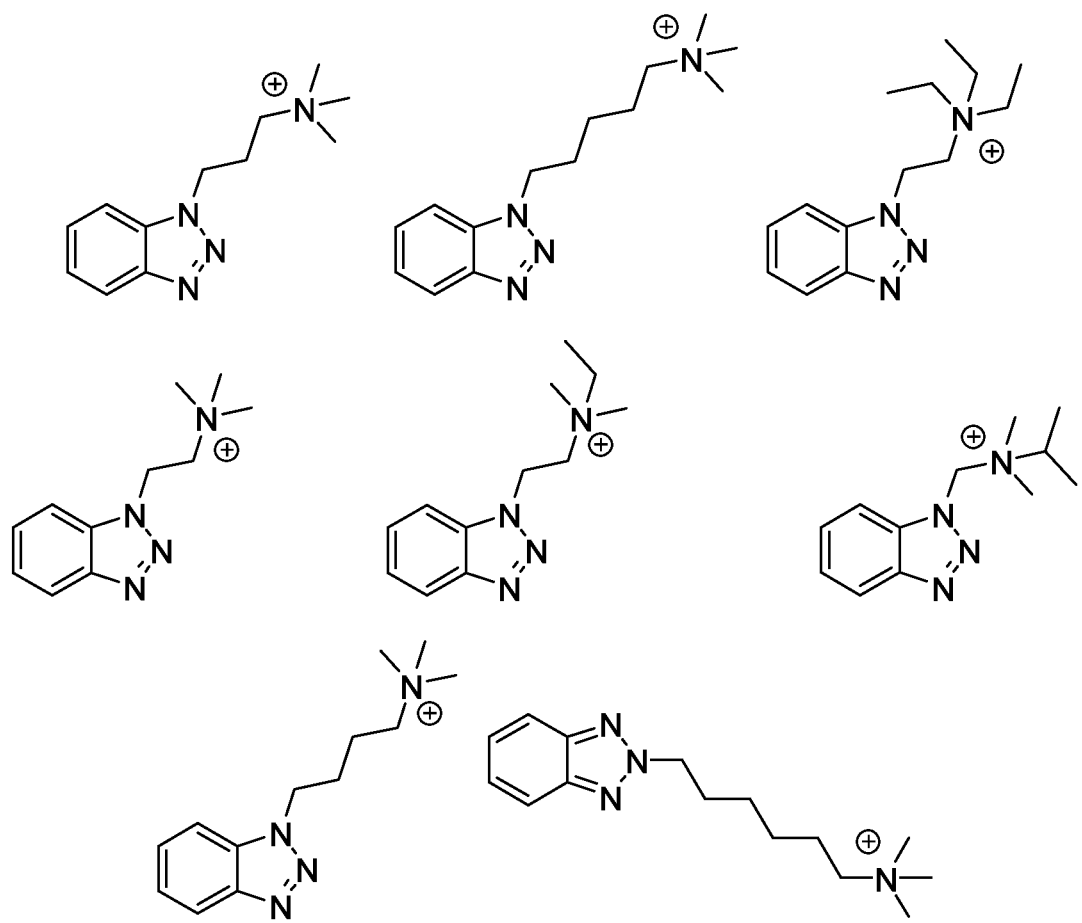
FIG. 9 illustrates cationic ligands having a benzotriazole moiety.

It is also interesting to note the similarities and differences in the optical behavior of the compounds in two sub-groups: While all of them emit at similar energies (green to yellow region) and have a broad single emission band at room temperature (FIG. 2b and FIG. 8), the optical band gaps of sub-group I compounds are considerably higher than those of the sub-group II compounds (Table 12, Inset of FIG. 2b and FIGS. 6-7). Clearly, photoluminescence (PL) of sub-group I does not correlate with their optical band gaps (FIG. 6), which is similar to that of $Cu_4I_4$ cubane based structures. Like most of the cubane structures, the sub-group I compounds also have short Cu—Cu distances (less than 2.8 Å, Table 3), suggesting that they may follow the same emission mechanism. Subgroup II compounds, on the other hand, have emission energies close to their estimated optical band gaps (FIG. 7), resembling those of $Cu_2I_2(L)_m$ dimer- and 1D-CuI(L) chain-based structures. The Cu—Cu ditances are generally longer in these compounds (with the exception of 10).

All members of this sub-group can be effectively excited by blue light, an important requirement for phosphors that can be used in conjunction with a blue LED chip in commercial WLED bulbs/lamps. Among them, compound 8 has a IQY of 71% under 450 nm excitation, comparing favorably to that of a benchmark yellow phosphor YAG: $Ce^{3+}$.

TABLE 12

Estimated optical band gaps, emission energies and colors,
IQY values decomposition temperatures of compounds 1-10.

| # | Structure | Optical Bandgap (eV) | $\lambda_{em}$ (nm) | Emission Color | IQY ($\lambda_{ex}$: 360 nm) | IQY ($\lambda_{ex}$: 450 nm) | $T_D$ (° C.) |
|---|---|---|---|---|---|---|---|
| | | | | Sub-Group I | | | |
| 1 | $Cu_3I_5(L1)_2$ | 2.9 | 560 | Yellow | 75 | — | 270 |
| 2 | $Cu_4I_6(L2)_2$ | 3.0 | 540 | Green-yellow | 92 | — | 270 |
| 3 | $Cu_4I_6(L3)_2$ | 3.0 | 535 | Green-yellow | 92 | — | 280 |
| 4 | $Cu_4I_6(L4)_2$ | 2.9 | 535 | Green-yellow | 75 | — | 280 |
| 5 | $Cu_5I_7(L5)_2$ | 3.0 | 575 | Orange | 70 | — | 310 |
| 6 | $Cu_6I_8(L6)_2$ | 3.0 | 530 | Green | 90 | — | 300 |
| | | | | Sub-Group II | | | |
| 7 | $Cu_2I_4(L7)_2$ | 2.3 | 555 | Yellow | 61 | 52 | 210 |
| 8 | $Cu_4I_6(tpp)_2(L8)_2$ | 2.5 | 540 | Green-yellow | 90 | 71 | 200 |
| 9 | $Cu_4I_6(tpp)_2(L9)_2$ | 2.5 | 545 | Green-yellow | 64 | 42 | 180 |
| 10 | $Cu_6I_8(L10)_2$ | 2.4 | 540 | Green-yellow | 70 | 51 | 200 |

$T_D$ = decomposition temperature

Figure 2:
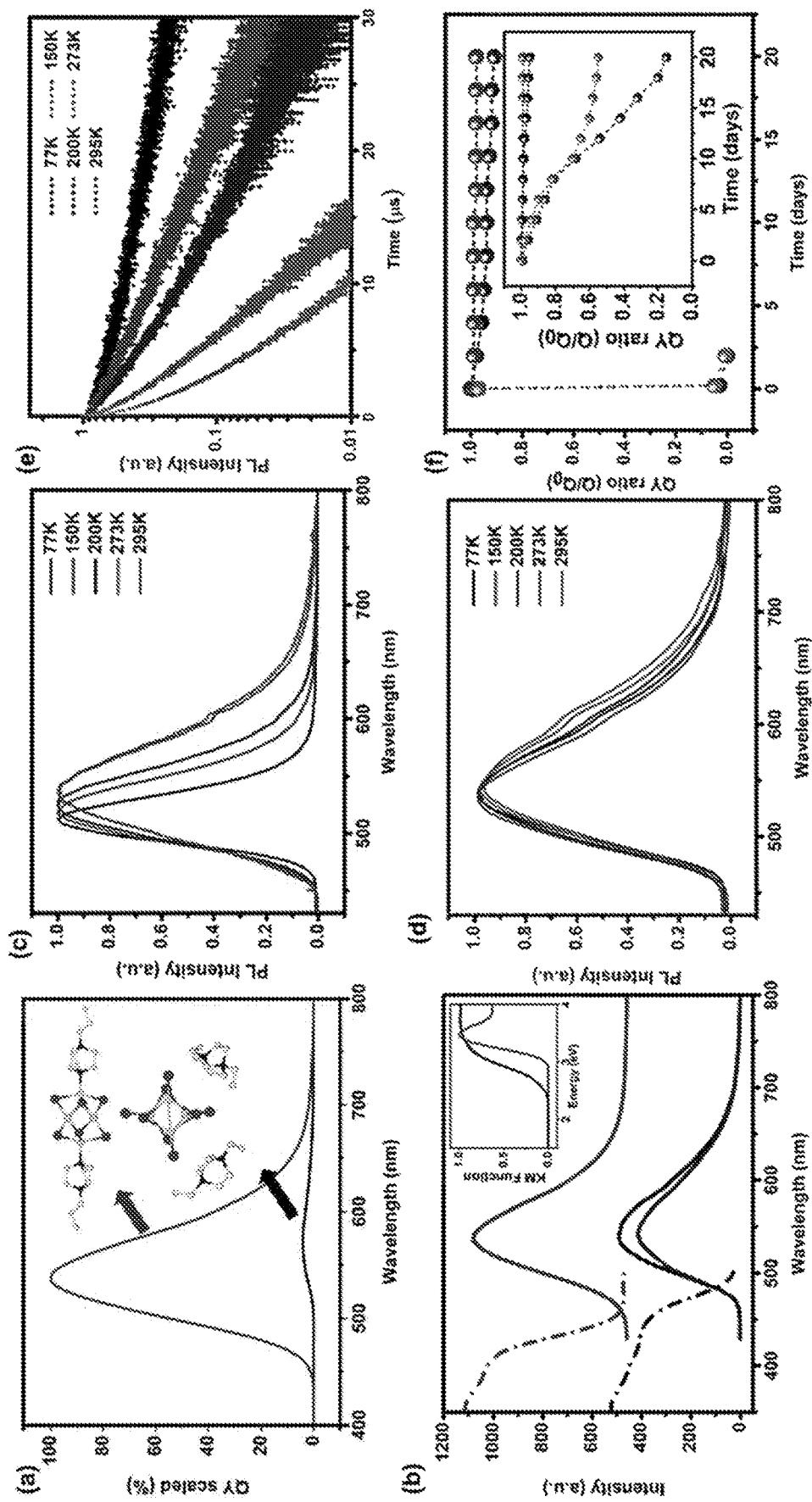
FIG. 2(*a*)-(*f*) illustrates PL properties of Compounds 1-10. (a) QY scaled emission spectra of 3 (red) and Cu4I8(di-et-ted)2. (b) Excitation (dotted) and emission (solid) spectra of 2 (red) and 8 (black: λex=360 nm, blue: λex=450 nm). Inset: optical absorption spectra of 2 (red) and 8 (black). (c) and (d) Emission spectra of 3 and 8 at various temperatures (λex=360 nm). (e) Luminesence decay profiles of 8 at various temperatures (λex=360 nm). (f) Plots of IQY ratios (Q0 and Q are IQY values measured before and after heating the sample at 100° C. in air as a function of time). Inset is the plot of ratios of the IQY values after and before exposing to UV light as a function of time. Blue: 0D-Cu2I2(py)4, green: 0D-Cu4I4(py)4, red: 3, black: 8.
Figure 3:
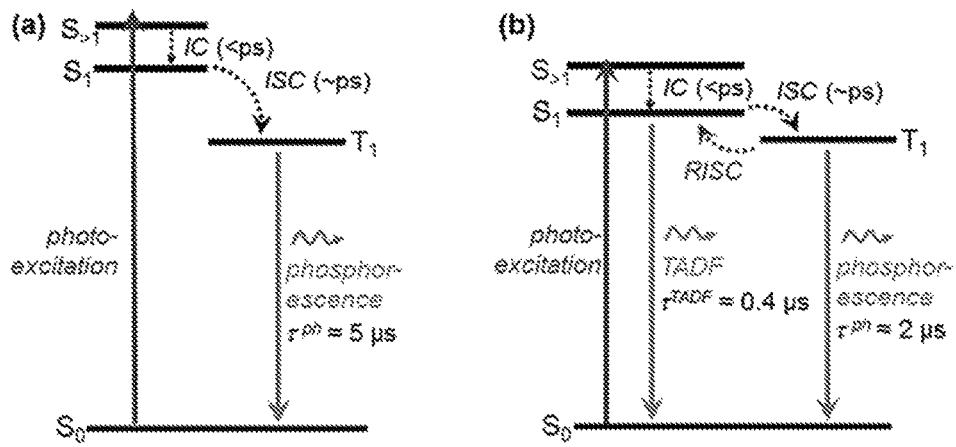
FIG. 3 illustrates Energy diagrams of (a) compound 3 indicating phosphorescence and (b) compound 8 indicating TADF and phosphorescence. The time constants expected for internal conversion (IC) and intersystem crossing (IC) are indicated along with those for TADF and phosphorescence.

The sub-group I compounds exhibit thermochromic behavior, as illustrated in FIG. 2c. For compound 3, lowering temperature results in a small blue shift in its PL accompanied by a peak width narrowing. This behavior can be attributed to reduced structural torsion at low temperatures and increased localization of the excited state on the molecular structure. On the other hand, sub-group II compounds do not show clear thermochromism. There is very little temperature dependence in their emission energies (FIG. 2d). The PL lifetimes of sub-group I compounds (e.g. 3 and 6) show very little or no dependence on temperature, which is characteristic of phosphorescence (Tables 4-5). Their PL lifetime decay curves are best fit with a single exponential decay function (Tables 4-5) with an average amplitude-weighted PL lifetime decay constant (r) of about 5 μs (FIG. 3a).

For sub-group II compounds (e.g. 8 and 10), however, the PL lifetimes have strong temperature dependence (FIG. 2e), with τ values decreasing from 23-24 μs at 77 K to 1.3-1.6 μs at 295 K (Tables S6-S7). Their PL lifetime decay curves are best fit by a double exponential decay function indicating that two separate processes may be contributing to the emission (Tables 6-7). For compound 8, as temperature increases there is generally an increase in the fraction of the short lifetime decay constant, $\tau_1$, and at 295 K, almost 50% of the PL lifetime decay is attributed to a relatively fast 380 ns component. This suggests that in addition to phosphorescence (~50%), a substantial fraction of the emission at room temperature originates from thermally-activated delayed fluorescence (TADF) (FIG. 3b, Table 6). TADF has been observed previously in organic-inorganic hybrid materials and is associated with small singlet to triplet energy differences (FIG. 3b) allowing exchange of electrons between the lowest excited triplet state ($T_1$) and the lowest excited singlet state (S1) prior to radiative recombination.

The lack of emission peak shifts with increasing temperature is also consistent with TADF and a small energy difference between $S_1$ and $T_1$. On the other hand, the absence of TADF for compound 3 (and other sub-group I compounds) is attributed to a large energy separation between $S_1$ and $T_1$ excited states which inhibits reverse intersystem crossing (RISC, FIG. 3a). This large energy difference is due to a higher lying $S_1$ state compared to sub-group II compounds and is consistent with the generally higher optical band gaps or shorter wavelength (higher energy) absorption onset observed in the optical absorption spectra of sub-group I compounds (Table 12, FIGS. 6-7).

Figure 4:
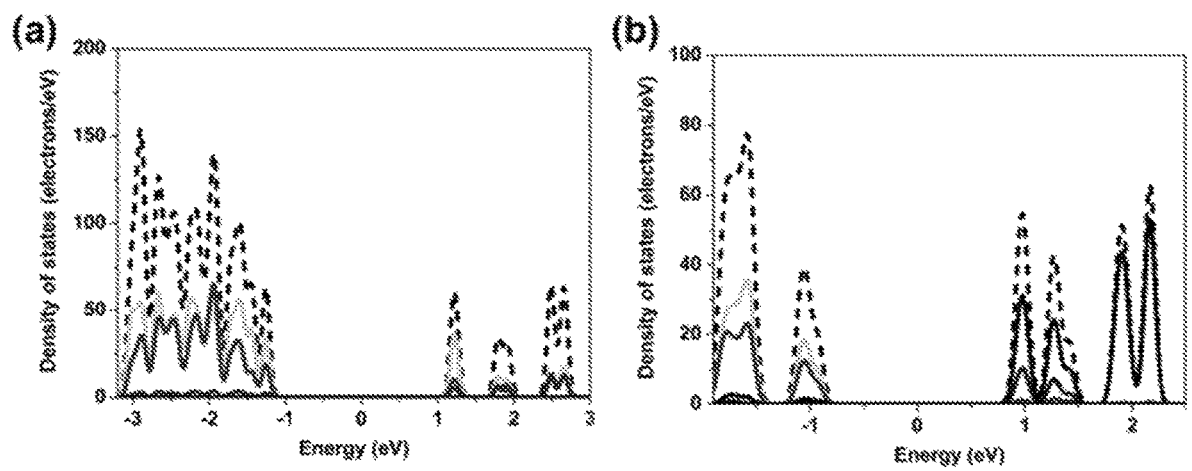
FIG. 4 illustrates Density of states (DOS) plots for compounds 5 (a) and 7 (b). Line color scheme: dashed black: total; cyan: Cu (3d); pink Cu (4s); red: I (5p); purple I (5d); blue: N (2p); black: C (2p).

Density functional theory (DFT) calculations were performed on selected structures from sub-group I (compounds 3 and 5) and sub-group II (compounds 7 and 8). The calculations correctly capture the experimental observation that optical band gaps of sub-group I are significantly larger than those of sub-group II (FIG. 4, Table 8). The valence bands of all four compounds share common features—the primarily contributions are from the inorganic components (Cu 3d and I 5p atomic orbitals, Table 9). However the contributions to the conduction bands are very different for compounds from the two sub-groups. For sub-group I compounds, they are mainly from Cu and I atomic orbitals (Cu 3d and I 5p, Table 10), supporting a "cluster-centered" (CC) charge transfer mechanism for the observed luminescence. For sub-group II compounds, they are mostly from organic ligands (C 2p and N 2p atomic orbitals, Table 10), and therefore, the emission is largely due to a metal-to-ligand charge transfer (MLCT) and iodine-to-ligand charge transfer (XLCT).

The greatly enhanced thermal stability of these AIO structures is reflected from thermogravimetric (TG) analysis of these compounds. The decomposition temperatures of sub-group I compounds are as high as 300° C. Most sub-group II compounds are stable up to 200° C. Compared to $Cu_mI_m$-based charge-neutral molecular clusters, which generally decompose below 80° C., the addition of ionic bonding stabilizes AIO structures by at least 100° C. To further evaluate their suitability as lighting phosphors, 3 and 8 were selected for long-term photo- and thermal-stability tests. After heating the selected samples at 100° C. for 20 days without protection, their IQY values were maintained at >90% compared to the initial values (FIG. 2f). Similarly, nominal decreases in their IQYs were detected after continuous UV irradiation on these samples for 20 days (Inset of FIG. 2f). The two reference materials, namely 0D-$Cu_2I_2$(py)$_4$ dimer and 0D-$Cu_4I_4$(py)$_4$ tetramer, however, suffered nearly 100% drop in their IQYs upon heating for merely one day, and their IQYs were reduced by ~50% and ~80% at the end of the photostability experiment.

Another advantage of these molecular clusters is their excellent solubility and dispersibility in common organic solvents, including chloroform, dimethylformamide (DMF), dimethyl sulfoxide (DMSO) (FIG. 5a). This makes it possible to fabricate films by solution-based process. High quality, continuous films of 3 were made by spin coating followed by thermal annealing. The film samples were characterized by optical microscope (FIG. 5b), powder X-ray diffraction (PXRD) analysis and atomic force microscopy (AFM) (FIG. 5c). Prototype LED bulbs using these materials as phosphors were assembled by remote model (FIG. 5d). The white-emitting bulb was generated by coating 8 on a commercial blue LED. High solution processability allows easy coating of the phosphors onto various substrates, including flexible papers or fabric. Compared to other three sub-classes that we have developed so far, the AIO family is the only one that meets all four standards essential for lighting phosphors: optical tunability, high quantum efficiency, excellent thermal and photo stability and solution processability (Table 11).

Additional compounds are summarized in Table 13. Besides the different colors resulting from unique ligands, the compounds also exhibit high thermal stability.

TABLE 13

Optical band gaps, emission energies and colors, IQY values and $T_D$

| Compound | Band Gap(eV) | $\lambda_{em}$ (nm) | Emission Color | QY(%) $\lambda_{ex}$: 360 nm | QY (%) $\lambda_{ex}$: 450 nm | $T_D$ (° C.) |
|---|---|---|---|---|---|---|
| 0D-Cu$_4$I$_6$(me-ted)$_2$ | 2.9 | 505 | Blue-green | 68 | — | 270 |
| 0D-Cu$_4$I$_6$(et-ted)$_2$ | 3.0 | 540 | Green-yellow | 75 | — | 270 |
| 0D-Cu$_5$I$_7$(i-bu-ted)$_2$ | 3.1 | 580 | Orange | 67 | — | 300 |
| 1D-Cu$_2$Br$_3$(bttmp) | 2.2 | 580 | Orange | 35 | 31 | 180 |
| 1D-Cu$_2$I$_3$(bttmpe) | 2.3 | 540 | Green-yellow | 77 | 68 | 200 |
| 1D-Cu$_2$I$_3$(btte) | 2.4 | 575 | Orange | 18 | 12 | 190 |
| 1D-Cu$_4$I$_6$(bttme)$_2$ | 2.4 | 550 | Yellow | 24 | 17 | 180 |
| 1D-Cu$_4$I$_6$(btedm)$_2$ | 2.2 | 520 | Green-yellow | 25 | 21 | 180 |
| 1D-Cu$_6$I$_8$(btmdp)$_2$ | 2.3 | 620 | Orange | 29 | 24 | 190 |
| 1D-Cu$_6$I$_8$(bttmbu)$_2$ | 2.4 | 535 | Green-yellow | 80 | 64 | 190 |
| 1D-Cu$_6$I$_8$(bttmhe)$_2$ | 2.7 | 590 | Orange | 24 | 20 | 190 |

It will be appreciated by persons skilled in the art that the present invention is not limited to what has been particularly shown and described. Rather, the scope of the present invention is defined by the claims which follow. It should further be understood that the above description is only representative of illustrative examples of embodiments. The description has not attempted to exhaustively enumerate all possible variations. The alternate embodiments may not have been presented for a specific portion of the invention, and may result from a different combination of described portions, or that other un-described alternate embodiments may be available for a portion, is not to be considered a disclaimer of those alternate embodiments. It will be appreciated that many of those un-described embodiments are within the literal scope of the following claims, and others are equivalent.

The invention claimed is:

1. A phosphor compound of $Cu_mX_{m+n}(L)_n$ wherein:
X is a halide,
L is a cationic organic ligand, wherein at least two atoms of the ligand are heteroatoms independently selected from the group consisting of N, O and S, one of the at least two atoms is positively charged N and the other of the at least two atoms is coordinated to Cu,
m is an integer selected from the group consisting of 1, 2, 3, 4, 5, 6, 7, 8, 9 and 10, and
n is an integer selected from the group consisting of 1, 2, 3, 4, and 5,
wherein the positively charged N is sp3 hybridized, and wherein the other of the at least two atoms is sp$^2$ hybridized N.

2. A method of emitting a visible light comprising
(a) placing a chip coated with a phosphor compound of claim 1 in conductive contact between an anode and a cathode within a reflective cavity; and
(b) passing a current from the anode to the cathode.

3. The method of claim 2, wherein the phosphor compound emits red, green, yellow, orange, pink, or blue light wavelengths.

4. The method of claim 2, wherein the phosphor compound displays intense luminescence with internal quantum yields (IQYs) greater than 60%.

5. A method of preparing the phosphor compound of claim 1, comprising the steps of
(a) providing a compound of CuX, wherein X is a halogen,
(b) mixing said CuX with the ligand L in a solution; and
(c) isolating said phosphor compound.

6. The method of claim 5, further comprising introducing triphenylphosphine in step (b).

7. The phosphor compound of claim 1, wherein X is I.

8. The phosphor compound of claim 1, wherein m is selected from the group consisting of 2, 3, 4, 5, 6, 7, and 8, and n is 2.

9. The phosphor compound of claim 1, wherein the positively charged N is bonded to at least three groups independently selected from C1-C10 alkyls, said alkyls optionally substituted with one or more groups selected from halogen, —OR$^1$, —SR$^1$, —C$_1$-C$_4$SR$^1$, —NO$_2$, —CN and —NR$^a$R$^b$, wherein R$^1$ at each occurrence is independently hydrogen (H) or C$_1$-C$_4$ alkyl, and R$^a$ and R$^b$ are independently hydrogen or C$_1$-C$_4$ alkyl.

10. The phosphor compound of claim 1, wherein the positively charged N is bonded to three alkyl groups independently selected from methyl, ethyl, isopropyl, butyl, said alkyls optionally substituted with one or more chlorine or bromine.

11. The phosphor compound of claim 1, wherein the other of the at least two atoms is a ring atom of benzotriazole, said benzotriazole optionally substituted with one or more substituents selected from the group consisting of C1-C10 alkyl, halogen, —OR$^1$, —SR$^1$, —C$_1$-C$_4$SR$^1$, —NO$_2$, —CN and —NR$^a$R$^b$, wherein R$^1$ at each occurrence is independently hydrogen (H) or C$_1$-C$_4$ alkyl, and R$^a$ and R$^b$ are independently hydrogen or C$_1$-C$_4$ alkyl.

12. The phosphor compound of claim 1, wherein the copper is coordinated to no more than 3 iodides.

13. The phosphor compound of claim 1, wherein the copper is coordinated to three iodides.

14. The phosphor compound of claim 1, wherein the ligand is selected from the group consisting of 1-(1H-benzo[d] [1,2,3]triazol-1-yl)-N,N,N-tri-methylmethanaminium (bttmm), N-((1H-benzo[d] [1,2,3]triazol-1-yl)methyl)-N,N-di-methyl ethanaminium (btmdme), N-((1H-benzo[d][1,2,3]triazol-1-yl)methyl)-N,N-di-butylbutan-1-aminium (btmdb), 3-(1H-benzo[d] [1,2,3]triazol-1-yl)-N,N,N-trim-ethyl-propan-1-aminium (bttmp), 5-(1H-benzo[d] [1,2,3]triazol-1-yl)-N,N,N-trimethyl-pentan-1-aminium (bttmpe), 2-(1H-benzo[d] [1,2,3]triazol-1-yl)-N,N,N-triethylethan-1-aminium (btte), 2-(1H-benzo[d] [1,2,3]triazol-1-yl)-N,N,N-trimethylethan-1-aminium (bttme), 2-(1H-benzo[d] [1,2,3]triazol-1-yl)-N-ethyl-N,N-dimethylethan-1-aminium (btedm), N-((1H-benzo[d] [1,2,3]triazol-1-yl)methyl)-N,N-dimethylpropan-2-aminium (btmdp), 4-(1H-benzo[d] [1,2,3]triazol-1-yl)-N,N,N-trimethylbutan-1-aminium (bttmbu), and 6-(2H-benzo[d] [1,2,3]triazol-2-yl)-N,N,N-trimethyl-hexan-1-aminium (bttmhe).

15. The phosphor compound of claim 1, which is selected from the group consisting of $Cu_4I_6(tpp)_2(bttmm)_2$, $Cu_4I_6(tpp)2(btmdme)2$, $Cu_6I_8(btmdb)2$, 1D-$Cu_2Br_3$(bttmp), 1D-$Cu_2I_3$(bttmpe), 1D-$Cu_2I_3$(btte), 1D-$Cu_4I_6$(bttme)$_2$, 1D-$Cu_4I_6$(btedm)$_2$, 1D-$Cu_6I_8$(btmdp)$_2$, 1D-$Cu_6I_8$(bambu)$_2$, and 1D-$Cu_6I_8$(bttmhe)$_2$.

16. A light-emitting diode characterized by a die in conductive contact with an anode and a cathode, said die comprising the phosphor compound according to claim 1.

17. A phosphor compound of $Cu_mX_{m+n}(L)_n$ wherein:
X is a halide,
L is a cationic organic ligand, wherein at least two atoms of the ligand are heteroatoms independently selected from the group consisting of N, O and S, one of the at least two atoms is positively charged N and the other of the at least two atoms is coordinated to Cu,
m is an integer selected from the group consisting of 1, 2, 3, 4, 5, 6, 7, 8, 9 and 10, and
n is an integer selected from the group consisting of 1, 2, 3, 4, and 5,
wherein the positively charged N is sp3 hybridized, and
wherein the compound is in a 1D, 2D or 3D crystalline lattice structure.

18. The phosphor compound of claim 17, wherein the other of the at least two atoms is $sp^3$ hybridized N.

19. The phosphor compound of claim 17, wherein the positively charged N is bonded to at least three groups independently selected from C1-C10 alkyls, said alkyls optionally substituted with one or more groups selected from halogen, —$OR^1$, —$C_1$-$C_4SR^1$, —$NO_2$, —CN and —$NR^aR^b$, wherein $R^1$ at each occurrence is independently hydrogen (H) or $C_1$-$C_4$ alkyl, and $R^a$ and $R^b$ are independently hydrogen or $C_1$-$C_4$ alkyl.

20. The phosphor compound of claim 17, wherein the ligand is selected from the group consisting of 1-benzyl-1,4-diazabicyclo[2.2.2]octan-1-ium ((bz-ted), 1-(3-chloro-propyl)-1,4-diazabicyclo[2.2.2]octan-1-ium ((3-Cl-pr-ted), 1-propyl-1,4-diazabi-cyclo[2.2.2]octan-1-ium (pr-ted), 1-(2-bromoethyl)-1,4-diazabi-cyclo [2.2.2]octan-1-ium (2-Br-et-ted), 1-isopropyl-1,4-diazabicyclo[2.2.2] octan-1-ium (i-pr-ted), and 1-butyl-1,4-di-azabicyclo[2.2.2]octan-1-ium (bu-ted).

21. The phosphor compound of claim 17, which the compound is selected from the group consisting of $Cu_3I_5$(bz-ted)$_2$, $Cu_4I_6$(3-Cl-pr-ted)$_2$, $Cu_4I_6$(pr-ted)$_2$, $Cu_4I_6$(2-Br-et-ted)$_2$, $Cu_4I_6$(i-pr-ted)$_2$, and $Cu_6I_8$(bu-ted)$_2$.

* * * * *